(12) United States Patent
Marrocco, III et al.

(10) Patent No.: US 8,308,978 B2
(45) Date of Patent: *Nov. 13, 2012

(54) POLYMER MATRIX ELECTROLUMINESCENT MATERIALS AND DEVICES

(75) Inventors: Matthew L. Marrocco, III, Rancho Cucamonga, CA (US); Farshad J. Motamedi, San Dimas, CA (US)

(73) Assignee: Sumitomo Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/737,220

(22) Filed: Dec. 15, 2003

(65) Prior Publication Data

US 2004/0131886 A1    Jul. 8, 2004

Related U.S. Application Data

(63) Continuation of application No. 09/879,752, filed on Jun. 12, 2001, now abandoned.

(60) Provisional application No. 60/211,108, filed on Jun. 12, 2000.

(51) Int. Cl.
| H01J 1/62 | (2006.01) |
| H01L 29/08 | (2006.01) |
| H01L 33/00 | (2010.01) |
| C09K 11/02 | (2006.01) |
| C09K 11/06 | (2006.01) |

(52) U.S. Cl. ............ 252/301.16; 428/917; 428/690; 313/504; 313/506; 257/40; 257/103; 252/301.35

(58) Field of Classification Search .......... 428/690, 428/917; 313/504, 506; 252/500, 301.16, 252/301.35, 301.36; 257/40, 102, 103
See application file for complete search history.

(56) References Cited

U.S. PATENT DOCUMENTS

| 3,994,855 | A | * | 11/1976 | Boberg | 523/126 |
| 4,666,742 | A | * | 5/1987 | Takakura et al. | 427/229 |
| 4,777,115 | A | * | 10/1988 | Koch et al. | 430/281.1 |
| 5,128,587 | A | | 7/1992 | Skotheim et al. | |
| 5,227,457 | A | | 7/1993 | Marrocco, III et al. | |
| 5,540,999 | A | | 7/1996 | Yamamoto et al. | 428/411.1 |
| 5,658,494 | A | * | 8/1997 | Bell et al. | 252/301.18 |
| 5,708,130 | A | | 1/1998 | Woo et al. | |
| 5,728,801 | A | | 3/1998 | Wu et al. | |
| 5,756,224 | A | | 5/1998 | Boerner et al. | 428/690 |
| 5,777,070 | A | | 7/1998 | Inbasekaran et al. | |
| 5,821,002 | A | | 10/1998 | Ohnishi et al. | |

(Continued)

FOREIGN PATENT DOCUMENTS

EP    0 697 744 A1    2/1996

(Continued)

OTHER PUBLICATIONS

Ng et al., Quinoxaline-based conjugated polymers containing ruthenium bipyridine, Macromolecules, 18, 1009-1016, 1997.*

(Continued)

*Primary Examiner* — Camie Thompson
(74) *Attorney, Agent, or Firm* — Pillsbury Winthrop Shaw Pittman LLP

(57) ABSTRACT

Photoluminescent and electroluminescent compositions are provided which comprise a matrix comprising aromatic repeat units and a luminescent metal ion or luminescent metal ion complex. Methods for producing such compositions, and the electroluminescent devices formed therefrom, are disclosed.

69 Claims, 4 Drawing Sheets

U.S. PATENT DOCUMENTS

| | | | |
|---|---|---|---|
| 5,834,020 A * | 11/1998 | Margerum et al. | 424/484 |
| 5,834,894 A | 11/1998 | Shirasaki et al. | |
| 5,962,631 A | 10/1999 | Woo et al. | |
| 5,989,738 A | 11/1999 | Haase et al. | |
| 6,169,163 B1 | 1/2001 | Woo et al. | |
| 6,203,725 B1 * | 3/2001 | Ogiso et al. | 252/301.35 |
| 6,392,250 B1 | 5/2002 | Aziz et al. | |
| 6,559,277 B2 * | 5/2003 | Rietz et al. | 528/397 |
| 6,869,693 B2 * | 3/2005 | Fryd et al. | 428/690 |
| 2002/0034656 A1 * | 3/2002 | Thompson et al. | 428/690 |
| 2002/0110701 A1 | 8/2002 | Wehrmann et al. | |

FOREIGN PATENT DOCUMENTS

| | | |
|---|---|---|
| EP | 0949695 A2 | 10/1999 |
| EP | 0 697 744 B1 | 1/2000 |
| JP | 10-204426 | 4/1998 |
| JP | 2000-063682 * | 2/2000 |
| JP | 2000-302718 * | 10/2000 |
| WO | WO 92/03490 | 3/1992 |
| WO | WO 94/15441 | 7/1994 |
| WO | WO 00/55927 | 9/2000 |

OTHER PUBLICATIONS

Thelakkat et al., Low Molecular Weight and Polymeric Heterocyclics as Electron Transport/Hole Blocking Materials in-Organic LightEmitting diodes, Polymers for Advanced Technologies, 9, 429-442 (1998).*

Adachi et al., "High-efficiency Red Electrophosphorescence Devices," *Applied Physics Letters*, vol. 78, No. 11, Mar. 2001, pp. 1622-1624.

Blasse et al., "Chapter 5, Energy Transfer," *Luminescent Materials*, Springer-Verlag, 1994, pp. 91-93.

Cazeca et al., "Enhanced Performance of Polythiophene Derivative Based Light Emitting Diodes by Addition of Europium and Ruthenium Complexes," *Synthetic Metals*, vol. 98, 1998, pp. 45-49.

Kraft et al., "Electroluminescent Conjugated Polymers—Seeing Polymers in a New Light," *Agnew. Chem. Int. Ed.* 1998, vol. 37, pp. 402-428.

McGehee et al., Narrow Bandwidth Luminescence from Blends with Energy Transfer from Semiconducting Conjugated Polymers to Europium Complexes, *Advanced Materials*, vol. 11, No. 16, 1999, pp. 1349-1354.

Salbeck et al., "Spiro Linked Compounds as Active Materials in Organic Light Emitting Diodes," *Polymer Preprints*, vol. 38, No. 1, Apr. 1997, pp. 349-350.

Yang et al., "Efficient Blue Polymer Light-emitting Diodes from a Series of Soluble Poly(paraphenylene)s," *J. Applied Phys*, vol. 79(2), Jan. 15, 1996, pp. 934-939.

Zhang et al., "Voltage-dependent Recombination Region Movement in Organic Light-emitting Diodes (OLEDs) Based on a Europium Complex-doped Polymer," *Journal of Luminescence*, 87-89, 2000, pp. 1149-1151.

Supplementary Partial European Search Report dated Nov. 16, 2004 for European Patent Application No. 01 948 324.7 and mailed Dec. 3, 2004 (3 pages).

Beljonne, D. et al., Spatial extent of the singlet and triplet excitons in transition metal-containing poly-ynes, *J. Chem. Phys.* (Sep. 1, 1996) vol. 105 (9), pp. 3868-3877.

Bernius, M. et al., Developmental Progress of Electroluminescent Polymeric Materials and Devices, in, SPIE Conference on Organic Light-Emitting Materials and Devices III, Denver, Colorado Jul. 19-21, 1999, *SPIE* vol. 37976, pp. 129-137.

Cazeca, M. et al., Enhanced performance of polythiophene derivative based light emitting diodes by addition of europium and ruthenium complexes, *Synthetic Metals* (1998) vol. 98, pp. 45-49.

Chawdhury, N. et al., Synthesis and Electronic Structure of Platinum-Containing Poly-ynes with Aromatic and Heteroaromatic Rings, *Macromolecules* (1998) vol. 31(3), pp. 722-727.

Epstein, A.J. et al., Poly (p-pyridine)—and poly (p-pyridyl vinylene)-based polymers: their photophysics and application to SCALE devices, *Synthetic Metals* (1996) vol. 78, pp. 253-261.

Kim, J. et al., Novel Layer-by-layer Complexation Technique and Properties of the Fabricated Films, *Chem Matter* (1999) vol. 11, pp. 2250-2256.

Kim, J. et al., Preparation and Properties of Luminescent Metal-Complex Containing Conjugated and Non-Conjugated Polymers, *Polymer Preprints* (American Chemical Society, Division of Polymer Chemistry) (1999) vol. 40(2), pp. 1237-1238.

Kohler, A. et al., Donor-acceptor interactions in organometallic and organic poly-ynes, *Synthetic Metals* (1999) vol. 101, pp. 246-247.

Kraft, A. et al., Electroluminescent Conjugated Polymers—Seeing Polymers in a New Light, *Angew. Chem. Int. Ed.* (1998) vol. 37, pp. 403-428.

McGehee, M. D. et al., Narrow Bandwidth Luminescence from Blends with Energy Transfer from Semiconducting Conjugated Polymers to Europium Complexes**, *Advanced Materials* (1999) vol. 11(16), pp. 1349-1354.

Wittmann, H.F. et al., Optical spectroscopy of platinum and palladium containing poly-ynes, *J. Chem. Phys.* (Aug. 1994) vol. 101(4), pp. 2693-2698.

Yu, W-L. et al., Spiro-Functionalized Polyfluorene Derivatives as Blue Light-Emitting Materials, *Advanced Materials* (2000) vol. 12(11), pp. 828-831.

Opposition to EP 1 297 060 B1 dated Jul. 2, 2008, filed in the European Patent Office Jul. 3, 2008 (21 pages).

Padmanaban, G., et al., Conjugation Length Control in Soluble Poly[2-methoxy-5-((2'-ethylhexyl)oxy)-1,4-phenylenevinylene] (MEHPPV): Synthesis, Optical Properties, and Energy Transfer, J. Am. Chem. Soc., 2000, 122(10), 2244-2251.

Lees, A.J., Luminescence Properties of Organometallic Complexes, Chem. Rev., 1987, 87, 711-743.

* cited by examiner

POLYMER MATRIX ELECTROLUMINESCENT MATERIALS AND DEVICES

CROSS-REFERENCE TO RELATED APPLICATIONS

The present application is a continuation of patent application Ser. No. 09/879,752, filed Jun. 12, 2001 now abandoned, which claims priority to provisional patent application No. 60/211,108, filed Jun. 12, 2000, entitled POLYMER MATRIX ELECTROLUMINESCENT MATERIALS AND DEVICES, the entire disclosures of which are expressly incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. N00014-02-C-0461, awarded by the United States Navy.

FIELD OF THE INVENTION

This invention relates to photoluminescent and electroluminescent compositions comprising a matrix comprising aromatic repeat units and a luminescent metal ion or a luminescent metal ion complex. The invention also relates to method for making such compositions and electroluminescent devices using such compositions.

BACKGROUND OF THE INVENTION

Many types of luminescent devices exist, including a number of all solid state devices. Solid state devices are preferable over incandescent or fluorescent bulbs in that they are lighter; more compact, can be made smaller, and can have higher efficiency. Examples of solid state luminescent devices are light emitting diodes (LEDs), such as gallium arsenide or silicon carbide LEDs, organic light emitting diodes (OLEDs), such as OLED displays being marketed by Uniax Corporation and CDT Ltd., and doped zinc sulfide devices that have been marketed for a number of years, for example by GE® as Limelite™ nightlights, and American Tack and Hardware, Co. Inc., (Monsey, N.Y.) as Nitelite™ nightlights. Any of these devices can be fabricated into arrays to represent numbers or letters, or pictures.

Of the various luminescent devices and displays the OLEDs are the newest and least mature technology. OLEDs typically consist of a thin film structure comprising a transparent electrode, usually indium doped tin oxide (ITO) on a glass or plastic support layer, the ITO optionally coated with polyaniline or poly(ethylenedioxythiophene) (PEDOT), one or more organic containing layers, typically a hole conducting layer, for example, of a triphenylamine derivative, a luminescent layer, for example, a polyphenylenevinylene derivative or a polyfluorene derivative, an electron conducting layer, for example, an oxadiazole derivative, and a second electrode, for example, calcium, magnesium, aluminum, and the like.

The advantages of the OLED devices are, lightweight, potentially low cost (although this has yet to be demonstrated commercially), the ability to fabricate thin film, flexible structures, wide viewing angle, and high brightness. The disadvantages of OLEDs are short device lifetimes, increasing voltages when operated in a constant current mode, and broad spectral widths. The efficiency of OLEDs is limited by the nature of the excited state of organic molecules. Typically, both the singlet and triplet excited states are populated during the operation of an OLED. Unfortunately, only decay from the singlet state produces useful light. Decay from the triplet state to a singlet ground state is spin forbidden and therefore slow, giving non-radiative processes more time to take place. Because the triplet state is three-fold degenerate and the singlet state is not degenerate; three quarters of the excited electrons enter the triplet state and produce little or no light.

An additional disadvantage of OLEDs is the relatively short lifetime of the excited state of organic molecules. In a display application each pixel is scanned 10 to 100 times every second, typically 60 times every second. It is desirable for the light from the pixel to decay on about the same time scale. If the pixel decays too slowly each subsequent image will be scanned over the not yet faded previous image, and the image will blur. If the pixel decays too quickly, there will be a noticeable flicker.

There is a need for a solid state device that is not limited by the short lifetimes of OLEDs. The short life of OLEDs is suspected to arise from the decomposition or alteration of the organic layers during operation.

There is also a need for electroluminescent devices that have stable I-V characteristics making the associated electronics simpler.

There is also a need for electroluminescent devices with pure color characteristics that are more amenable to color displays. For color television, monitors, and the like, red, blue, and green devices with exacting color are required.

There is also a need for electroluminescent devices with higher efficiency, not limited by decay from non-luminescent triplet states.

There is also a need for electroluminescent devices with phosphorescent decay times in the appropriate range for scanned displays and passive displays.

SUMMARY OF THE INVENTION

In one aspect, the present invention is directed to a polymer composition comprising repeat units selected from the group consisting of:

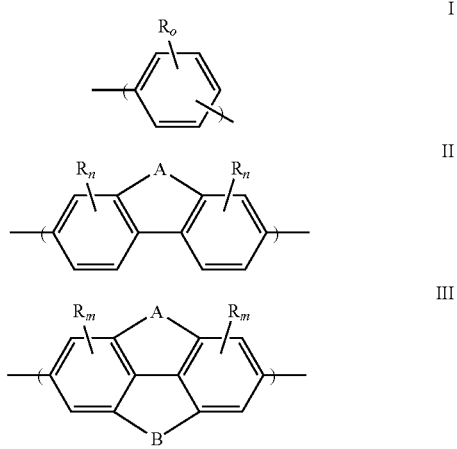

-continued

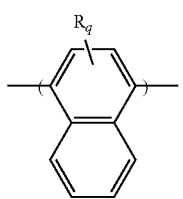

IV

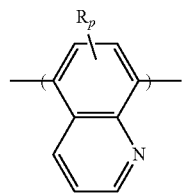

V

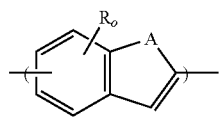

VI

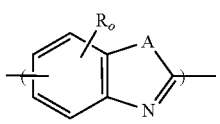

VII

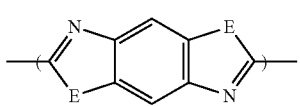

VIII

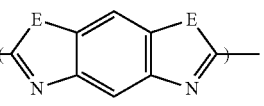

IX

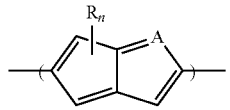

X

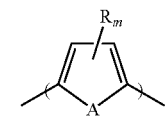

XI

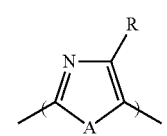

XII where R is independently selected from H, D, F, Cl, Br, I, alkoxy, aryloxy, alkyl, aryl, alkyl ketone, aryl ketone, alkylester, arylester, amide, carboxylic acid, fluoroalkyl, fluoroaryl, polyalkalene oxy, any two of the R groups may be bridging, m is 0-2, n is 0-3, o is 0-4, p is 0-5, q is 0-6, r is 0-7, A and B are independently selected from the group consisting of —O—, —S—, —NR$_1$—, and —CR$_1$R$_2$—, —CR$_1$R$_2$CR$_3$R$_4$—, —N=CR$_1$—, —CR$_1$=CR$_2$—, —N=N—, and —(CO)— where R$_1$-R$_4$ are H, D, F, Cl, Br, I, alkyl, aryl, alkyleneoxy, polyalkyleneoxy, alkoxy, aryloxy, fluoroalkyl, and fluoroaryl, two of the R groups may be bridging, and E is selected from the group consisting of O, NH, and S, and one or more fluorescent metal ions.

In another aspect, the invention is directed to an electroluminescent device comprising the composition set forth above. In one embodiment, the electroluminescent device comprises a first electrode, one or more charge transport layers, an electroluminescent layer comprising the composition set forth above and a second electrode.

BRIEF DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION

Figure 1:
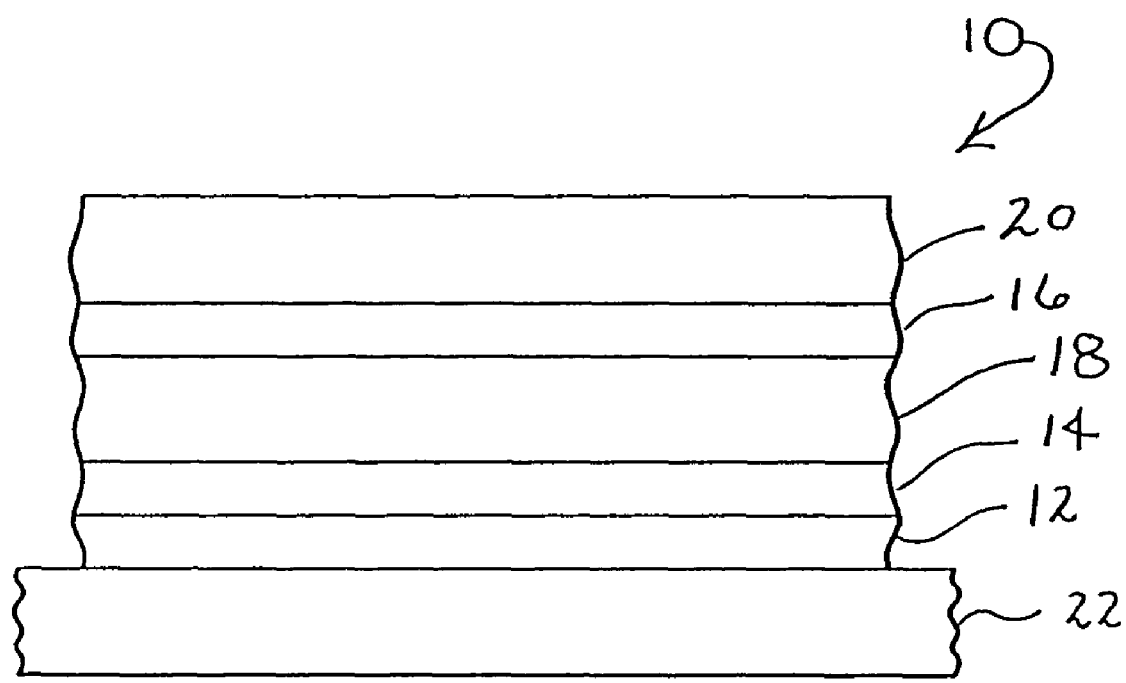
FIG. 1 is a semi-schematic side view of one embodiment of an electroluminescent device provided in accordance with practice of the present invention.

In order to overcome the deficiencies of previous luminescent devices it would be desirable to have a device with higher efficiency than current OLEDs, and with longer lifetimes. It would also be desirable to have a device that operated at low voltage, preferably less than 20 volts, more preferably less than 15 volts, even more preferably less than 10 volts, and most preferably less than 5 volts DC. It would also be desirable to have a device with good color quality, and appropriate phosphorescent decay time for displays.

We have found that many of the disadvantages of OLEDs may be overcome by use of a combination of a fluorescent metal ion and an organic matrix designed to collect and deposit energy into the fluorescent metal ion, as the luminescent layer(s) in an electroluminescent device. The matrix typically comprises a polymer, but may be an oligomer, or discrete molecules. The matrix will accept electrons and/or holes from the electrodes and transport them toward the center of the device where they recombine to produce an excited electronic state in the matrix. Materials that fluoresce well tend to also electroluminesce well, and are thus good candidates for the matrix of the present invention. The band gap of the matrix (or in other terms the HOMO-LUMO difference) will determine the energy of the excited state, and how much energy is available to excite the luminescent metal. A polymer matrix that luminesces in the red will generally not be able to transfer energy to a metal that luminesces blue, except in the unusual case of a two photon or higher order process. Thus it is desirable to choose a polymer matrix that luminesces blue, indigo, violet, or ultraviolet, i.e., the high energy part of the spectrum, so that transfer to metals that luminesce blue, green, or red is possible.

The fluorescent spectrum of organic polymers, oligomers, and discrete organic molecules are typically very broad, often 50 or 100 nm wide. The absorption and emission bands of lanthanide metals are very narrow, typically 5 to 20 nm, because the bands result from transitions between f orbitals which are "buried" within outer filled d and s orbitals. Since they are screened by the outer d and s orbitals they are less effected by external electric fields and transitions within the f manifold are not broadened. The narrow bands provide very pure colors, a desirable feature for display fluorophors.

Lanthanide metals have been used as cathodoluminescent materials for many years in color television picture tubes, commonly called cathode ray tubes (CRTs). It is well known that certain lanthanide metals have fluorescent bands very near the ideal color coordinates for red, blue and green, in CRTs. By using a polymer matrix (with its broad spectrum) to excite a lanthanide metal (with its narrow spectrum, and good color coordinates) a much better color rendition is achieved. The lanthanides are yttrium, lanthanum, cerium, praseodymium, neodymium, promethium, samarium, europium, gadolinium, terbium, dysprosium, holmium, erbium, thulium, ytterbium, and lutetium.

Lanthanide metals, and other luminescent metals, have excited state lifetimes that are closer to the lifetime needed for displays than are the lifetimes of organic materials.

The excited state of a lanthanide ion produces much more light (about four times more) than an excited organic compound. Also, the luminescent metal ion or complexes can accept energy from both singlet and triplet states of organic molecules. In this way, the excited energy in the organic singlet state that was otherwise destined to be lost to non-radiative transitions is transferred to a metal, which then radiates.

Metal ions are much less subject to bleaching or chemical reactions that destroy the fluorophor than organic species. The term fluorophor is used here to mean the chemical system that absorbs energy and re-emits it, typically the emitted energy is light of lower energy than the absorbed energy. The chemical system may be an atom, an ion, a molecule, a metal complex, an oligomer, a polymer, or two or more atoms, ions, or molecules in close proximity, capable of exchanging energy. Fluorophors may be, but are not limited to being, photoluminescent, fluorescent, phosphorescent, cathodoluminescent, or electroluminescent. Although the devices of the instant invention are still partly organic, the metal ions exert a protective effect by removing energy from the organic excited state. The devices of the present invention are thus expected to have longer lifetimes than all organic devices.

In the practice of the present invention, a luminescent or fluorescent metal ion or complex, preferably a lanthanide metal ion or complex, is embedded within a fluorescent organic matrix, producing a system wherein the organic matrix may be elevated to an excited state, which then transfers its energy to the metal ion or complex which then emits light. The energy transfer between organic matrix and metal may be enhanced by providing coordination sites for the metal on the organic matrix. The energy transfer may also be enhanced by providing the metal with polarizable ligands.

The luminescent metal ion may be any metal ion or metal complex that luminesces, including, but not limited to, transition metal ions such as manganese, silver, ruthenium, iridium, and platinum, lanthanide ions, and complexes thereof. Lanthanide ions are preferred because of their narrow spectral line widths.

The electroluminescent (EL) compositions and EL devices of the present invention will have very narrow emission lines because the emission is primarily from a lanthanide metal ion. As noted above, lanthanide metal ions have narrow emission bands, typically 5 to 20 nm in width (full width at half maximum, FWHM). The FWHM of the electroluminescent compositions and devices of the present invention will be less than about 50 nm, preferably less than about 20 nm, more preferably less than about 10 nm, even more preferably less than about 8 nm, yet more preferably less than about 5 nm, even yet more preferably less than about 4 nm, and most preferably less than 3 nm.

The luminescent metal ion may be coordinated or complexed to a ligand, or may be complexed or coordinated to a polymer. One or more counter ions may also be present, and these may or may not coordinate to the metal. The luminescent metal ions may form clusters or may be part of a cluster of metals. Ligands and counter ions may also coordinate two or more luminescent metals, in a bridging fashion.

The luminescent metal ions may be present as part of an inorganic solid. For example, an inorganic powder, comprising a luminescent metal ion may be mixed with a luminescent polymer. The inorganic powder is preferably 400 mesh (average particle size less than about 38 microns), or finer, more preferably less than about 20 microns, even more preferably less than about 5 microns, and most preferably less than about 3 microns. The inorganic powder may be a nanosized powder with average physical dimensions in the 1 to 1000 nanometer range, preferably less than about 500 nanometers, and more preferably less than about 100 nanometers. Nanometer sized particles have very high surface to volume ratios and a high fraction of the metal ions are at the surface of the particle or within several angstroms (several tens of nanometers) of the surface, making energy transfer from a polymer in which the powder is embedded possible. Nanosized particles less than about 300 nm do not scatter visible light. In the practice of the present invention, the light emitting films may be less than 1000 nm and, if particles are to be used, the particles must be smaller than the film thickness. The inorganic solid may be a semiconductor. Non-limiting examples of semiconductors are gallium nitride, tin oxide, zinc oxide, zinc sulfide, cadmium sulfide, cadmium selenide, lead oxide, and the like. Semiconductors comprising elements of groups II and VI (II-VI semiconductors) can often be prepared by wet chemical methods and are therefore preferred.

Merely mixing a fluorescent polymer with a fluorescent metal ion or complex does not guarantee that energy can be transferred from the polymer to the metal. The excited state of the polymer must be at a higher energy level than the excited state of the metal, otherwise little or no energy will be transferred. Additionally, we have found that the probability of energy transfer can be increased by providing a polymer having functional groups, either side groups, or main chain groups, or end groups, that bind or coordinate to the luminescent metal ion, or metal complex. Any functional group that coordinates to a metal may be used. It will be understood by one skilled in the art how to determine if a functional group is coordinated, for example, by observation of spectral shifts of the functional group in the IR, visible, or NMR spectra. Functional groups may be monodentate, or chelating multidentate, or macrocyclic. Functional groups that may be used include but are not limited to amines, amides, alcohols, alpha diketones, alpha ketoalcohols, beta diketones, beta ketoalcohols, beta ketoacids, bipyridines, biquinolines, borates, carboxylic acids, catecols, diols, hydroxyquinolines, phenanthrolenes, phenols, phosphates, polyamines, polyethers, pyridines, quinolines, salicylates, sulfates, thioethers, thiols, thiophenes, and the like. Functional groups may lose one or more protons upon coordination to the luminescent metal ion.

The functional groups on the polymer may replace all or some of the ligands on the fluorescent metal. That is, the metal may have additional ligands other than the polymer functional groups, including coordinated solvent, and coordinated counter ions. We have also found that the luminescent metal ion complex may be chosen to enhance energy transfer from polymer to metal. Even if the metal is not bound directly to the polymer by a covalent or coordinate bond, energy transfer may be enhanced by choosing a ligand that interacts with the polymer, e.g., by van der Waals, hydrogen bonds, dipole-dipole, dipole-induced dipole, or other non-covalent interaction. Energy transfer may be enhanced by use of a ligand bearing polarizable groups, for example, aromatic groups and especially multiple or fused ring aromatic groups such as biphenyl, triphenyl, quaterphenyl, naphthyl, anthracenyl, phenanthrenyl, pyridyl, quinolinyl, phenanthrolinyl, benzoxazolyl, and the like. A polarizable ligand in general has electrons that can respond to an electric or electromagnetic field. For the purposes of the present invention, a polarizable ligand will have at least one double bond; preferably, a carbon-carbon double bond. More preferably, the polarizable ligand will have two or more double bonds; even more preferably, three or more double bonds; yet more preferably, four or more double bonds; even yet more preferably, five or more double bonds; and most preferably, six or more double bonds. It is further preferable that some or all of the double bonds be conjugated with one another. The double bonds may be part of an aromatic or heteroaromatic ring, such as a benzene, pyridine, or quinoline ring. The aromatic ring may be terminal (eg., phenyl) or internal (e.g., phenylene). For the purposes of the present invention, conjugated ligands are polarizable ligands.

Non-limiting examples of polarizable ligands include benzoylacetone, dibenzoylmethane, benzoin, phenanthrolene, phenylphenanthrolene, bipyridine, phenylbipyridine, diphenylbipyridine, Ar(CO)(CHOH)Ar', Ar(CO)CH$_2$(CO)Ar', salicylic acid, salicylaldehyde, phenylsalicylic acid, phenylsalicylaldehyde, adenine, purine, 2-aminobenzophenone, 2-amino-4-chlorobenzophenone, 2-(2-hydroxyphenyl)benzothiazole, 2-(2-hydroxyphenyl)quinoline, 1-naphthol-2-carboxaldehyde, 1,2-dihydroxybenzene, 1,2-dihydroxynaphthalene, 2,3-dihydroxynaphthylene, 1,8-dihydroxynaphthylene, 1-hydroxybenzophenone, 1-hydroxyfluorenone, 7-hydroxyinden-1-one, 7-hydroxy-3-phenylinden-1-one, salen, 8-hydroxyquinoline, 8-hydroxyquinazoline, 8-hydroxyquinoxaline, 4-hydroxybenzoxazole, 7-hydroxybenzoxazole, 4-hydroxy-2-phenyl benzoxazole, 7-hydroxy-2-phenylbenzoxazole, hypoxanthine, and the like. Aryl, Ar and Ar' are independently selected from the group consisting of phenyl, 2-biphenyl, 3-biphenyl, 4-biphenyl, 1-naphthyl, 2-naphthyl, 2-pyridyl, 3-pyridyl, 4-pyridyl, terphenyl (any isomer), quaterphenyl (any isomer), anthracenyl, phenanthrenyl, pyridyl, quinolinyl, phenanthrolinyl, benzoxazolyl, and quinazolinyl, optionally substituted with D (deuterium), F, Cl, Br, I alkyl, alkoxy, polyalkaleneoxy and fluoroalkyl. Preferably a ligand will have at least one aromatic ring, more preferably a ligand will have at least two aromatic rings, even more preferably a ligand will have at least three aromatic rings. Preferably a ligand will have a direct bond between two of the aryl groups such that they form a biaryl group, or will have two rings in a fused ring system. Biaryls and fused rings have higher polarizability than single ring systems and therefore will couple better to the polymer excited state. It is also preferable for the ligand to have a triaryl group or fused three-ring group.

Non-limiting examples of general structural formulae of polarizable ligands are shown below.

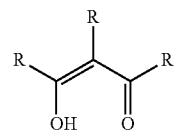

1

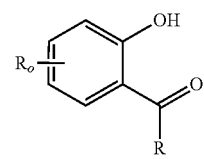

2

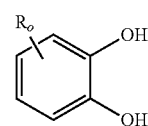

3

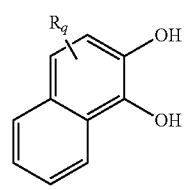

4

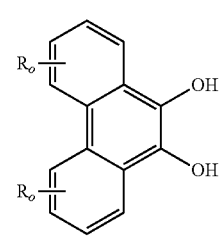

5

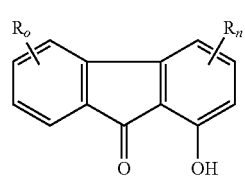

6

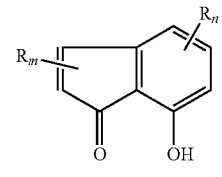

7

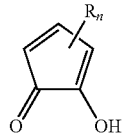

8

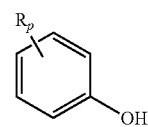

9

-continued

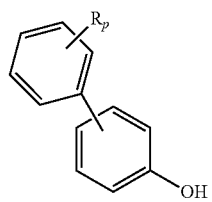

11

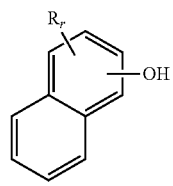

12

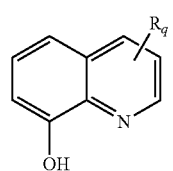

13

14

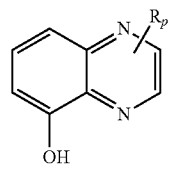

15

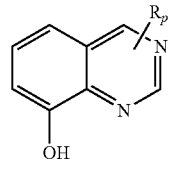

16

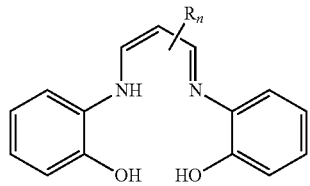

17

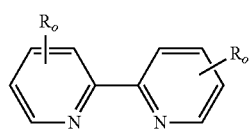

18

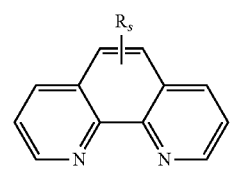

-continued

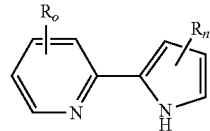

19 where R is independently selected from H, D, F, Cl, Br, I, alkoxy, aryloxy, alkyl, aryl, alkyl ketone, aryl ketone, alkylester, arylester, amide, carboxylic acid, fluoroalkyl, fluoroaryl, polyalkalene oxy (e.g. methoxyethoxyethoxy, ethoxyethoxy, and $-(OCH_2CH_2)_xOH$ x=1-100), two of the R groups may be bridging, m is 0-2, n is 0-3, o is 0-4, p is 0-5, q is 0-6, r is 0-7, and s is 0-8. The R groups may be on any ring in a multiple ring structure. For example, in structure 12 there may be R groups on the heterocyclic ring, on the phenolic ring, or on both. An example of bridging R groups is given in structure 20 below. Structure 20 is derived from structure 8 where two of the R groups taken together are $-CH=CH-CH=CH-$.

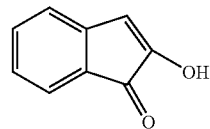

20

Additional examples of polarizable ligands include $R-C_6H_4-CO_2H$, $R-C_6H_4-SO_3H$, $R-C_6H_4-PO_3H_2$, substituted nicotinic acids $R-C_5H_3N-CO_2H$, substituted salicylic acids, and the like.

It will be apparent to one skilled in the art that the polarizable ligands could be used as functional groups if they are covalently attached to a polymer chain. For example, any of the R groups in the structures could represent a polymer chain. A polarizable ligand may also form part of the backbone of a polymer chain, for example, being attached through R groups (in the cases where R has a hydrogen that may be replaced by a polymer chain, e.g. aryl, alkyl, but not e.g. F, Br)

The general formula for a polarizable ligand as part of the backbone of a polymer chain is: $-(R\text{-polarizable ligand-}R)-(Y)-$ wherein Y is a generalized repeat unit.

A specific example of the foregoing is:

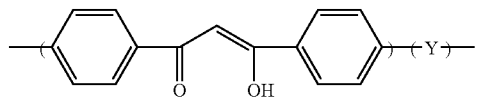

21

In structure 21 Y is a generalized repeat unit, and could be, for example, any of the repeat units I-XII below.

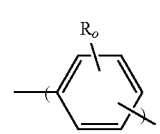

I

-continued

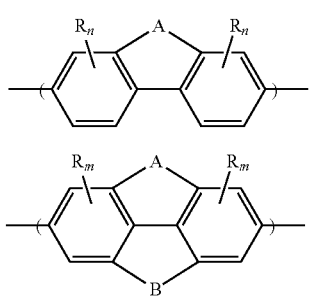  II

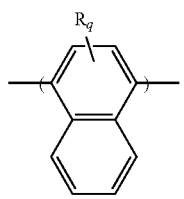  III

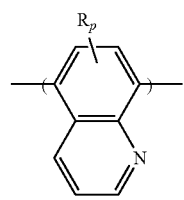  IV

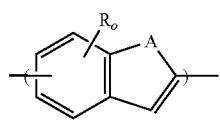  V

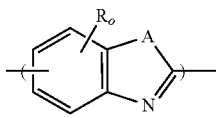  VI

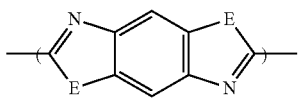  VII

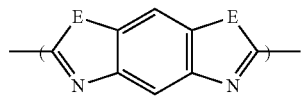  VIII

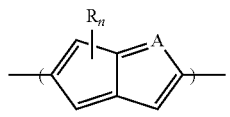  IX

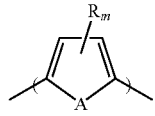  X

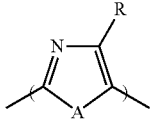  XI

XII where R is independently selected from H, D, F, Cl, Br, I, alkoxy, aryloxy, alkyl, aryl, alkyl ketone, aryl ketone, alky-lester, arylester, amide, carboxylic acid, fluoroalkyl, fluoroaryl, polyalkalene oxy, any two of the R groups may be bridging, m is 0-2, n is 0-3, o is 0-4, p is 0-5, q is 0-6, r is 0-7, and A and B are independently selected from the group consisting of —O—, —S—, —NR$_1$—, —PR$_1$— and —CR$_1$R$_2$—, —CR$_1$R$_2$CR$_3$R$_4$, —N=CR$_1$—, —CR$_1$=CR$_2$—, —N=N—, and —(CO)— where R$_1$-R$_4$ are H, D, F, Cl, Br, I, alkyl, aryl, alkyleneoxy, polyalkyleneoxy, alkoxy, aryloxy, fluoroalkyl, and fluoroaryl, two of the R groups may be bridging, and E is selected from the group consisting of O, NH, and S.

The polymers of the present invention are typically aromatic polymers, having relatively short conjugation lengths leading to fluorescence in the blue to ultraviolet region. Preferably the conjugation length will be 2 to 50 conjugated rings, more preferably 3 to 10 conjugated rings, even more preferably 3 to 6 conjugated rings. Some or all of the rings may be part of a fused ring system. Conjugation length, and therefore absorption and emission wavelengths, may be controlled with non-aromatic spacer groups. Non-limiting examples of spacer groups, or repeat units are —O—, —S—, —NR—, —CR$_1$R$_2$—, —(CH$_2$)$_n$—, —(CF$_2$)$_n$—, ester, amide, and the like. The polymers may be homopolymers, or copolymers. The polymers may be linear, branched, hyperbranched, dendritic, crosslinked, random, block, graft, or any structural type. It may be desirable to utilize dendritic or hyperbranched polymers to channel energy into a luminescent metal held at or near the core of the polymer molecules. In this way the luminescent metals are naturally isolated from one another avoiding concentration effects, and may be more evenly distributed in the polymer matrix allowing higher metal concentrations and greater brightness. Examples of polymers are those having repeat units selected from the groups consisting of:

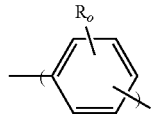  I

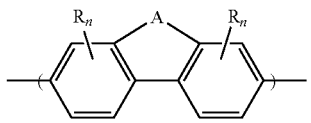  II

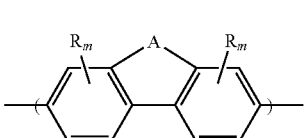  III

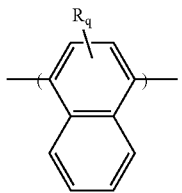  IV

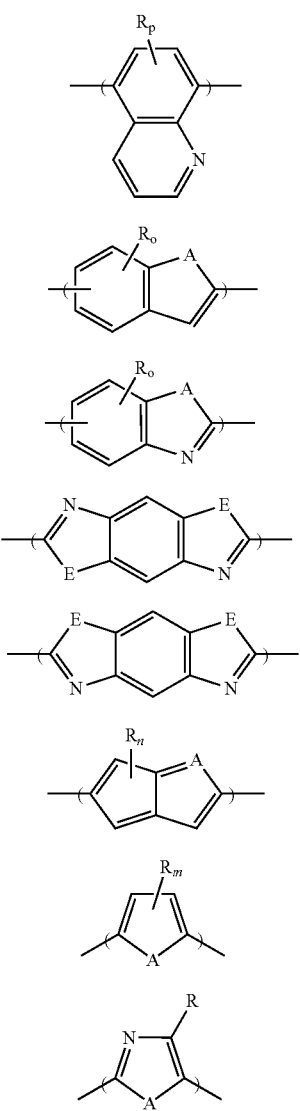

where R is independently selected from H, D, F, Cl, Br, I, alkoxy, aryloxy, alkyl, aryl, alkyl ketone, aryl ketone, alkylester, arylester, amide, carboxylic acid, fluoroalkyl, fluoroaryl, polyalkalene oxy, any two of the R groups may be bridging, m is 0-2, n is 0-3, o is 0-4, p is 0-5, and q is 0-6, A and B are independently selected from the group consisting of —O—, —S—, —NR$_1$—, and —CR$_1$R$_2$—, —CR$_1$R$_2$CR$_3$R$_4$—, —N=CR$_1$—, —CR$_1$=CR$_2$—, —N=N—, and —(CO)— where R$_1$-R$_4$ are H, D, F, alkyl, aryl, alkyleneoxy, polyalkyleneoxy, alkoxy, aryloxy, fluoroalkyl, and fluoroaryl, two of the R groups may be bridging, m is 0-2, n is 0-3, o is 0-4, p is 0-5, q is 0-6, and r is 0-7, and E is selected from the group consisting of O, NH, and S, and one or more fluorescent metal ions.

The molecular weight (MW) of the organic matrix, or aromatic matrix, or aromatic hydrocarbon matrix, will greatly influence the properties of the device and the ease of fabrication of the device. Polymers are used as matrices partly because polymer may be cast into thin films by spin coating, a relatively low cost method. Other methods, such as screen-printing and ink jet printing, also require controlled viscosity of the solution carrying the materials to be printed. Polymers are very effective at controlling the viscosity by adjusting their MW and concentration. The MW of the conjugated polymers will also have an influence on conductivity of the resulting film. The MW should be high, preferably greater than about 30,000 Dalton, more preferably greater than about 50,000 Dalton, even more preferably greater than about 100,000 Dalton, and yet more preferably greater than about 150,000 Dalton, and most preferably greater than about 200,000 Dalton as measured by gel permeation chromatography (GPC) using techniques well known in the art and referenced against polystyrene standards. A high MW will aid in spin coating and printing operations. A high MW will also prevent the material from crystallizing in use, which is detrimental to device performance.

The solution viscosity may also be used as a relative measure of MW. The viscosity may be measured, for example, by using an Ubbelohde viscometer to find the specific viscosity at several concentrations and extrapolating the intrinsic viscosity. The intrinsic viscosity of the rigid and semi-rigid polymers of the present invention is preferably greater than 0.8 dL/g, more preferably greater than 1 dL/g, even more preferably greater than about 1.5 dL/g, and most preferably greater than about 2 dL/g. Intrinsic viscosity greater than 3 dL/g may also be desirable in certain cases. The viscosity of polymers that are not fully conjugated and having non-aromatic spacer groups may be lower, preferably greater than 0.3 dL/g, more preferably greater than 0.5 dL/g, and most preferably greater than 0.6 dL/g. Inherent viscosity is sometimes used as a simpler measure than intrinsic viscosity. For the purposes of the present invention, inherent viscosity of greater than 1 is preferred, more preferably greater than 1.5, even more preferably greater than 2 dL/g, for rigid or highly conjugated polymers. Lower inherent viscosity is preferred for non-rigid, non-fully conjugated polymers, e.g., 0.3 dL/g, more preferably greater than 0.5 dL/g, and most preferably greater than 0.6 dL/g.

A polymer matrix may be thermoplastic or thermoset. It may be desirable to use a crosslinked or thermoset type polymer to improve the stability of an EL layer. In this case the metal ion or complex is mixed with a polymer precursor, preferably forming a homogeneous mixture, which is then cured using any means known in the art, including, but not limited to, thermal, UV, e-beam, microwave, photo, and chemical curing. For example, a highly aromatic bisepoxide is blended with a (optionally highly aromatic) hardener, and a lanthanide metal complex bearing aromatic groups. The ligands on the metal complex are chosen such that the metal complex remains homogeneously distributed during and after curing the epoxy and do not phase separate. The ligands may also contain thermosetting groups, for example, a ligand bearing an epoxy group, which will become part of the polymer matrix on curing. The ligands are also chosen such that energy transfer from excited states of segments of the epoxy chain to the metal complex or ion is efficient. The epoxy/hardener/lanthanide metal mixture is then applied as needed, for example, as a thin film, and cured. It may be desirable to include a solvent in the epoxy/hardener/lanthanide metal mixture to aid film formation, which solvent is removed before, during, or after curing. Similarly, other thermosetting systems may be used, including but not limited to, cyanate ester, ethynyl, maleimide, nadimide, olefin/vulcanizer, phenolic, phenyethynyl, silicone, styrenic, urethane, and the like.

The matrix may be oligomeric, that is relatively short chain of repeat units. Oligomers may be desired over polymers to achieve lower melt viscosity or ease of synthesis. Oligomers have advantages over small molecules in that oligomers are more readily processed to give amorphous films.

The matrix may also be composed of small molecules. It is preferable to use molecules or mixtures of molecules that can be processed into amorphous or glassy films. For example, it is known in the art that spiro type molecules such as 22 (J. Salbeck, J. Bauer, and F. Weissortel, Polymer Preprints, 38, (1) 1997), will form glassy films that are highly fluorescent. The Salbeck et al. article is incorporated herein by this reference.

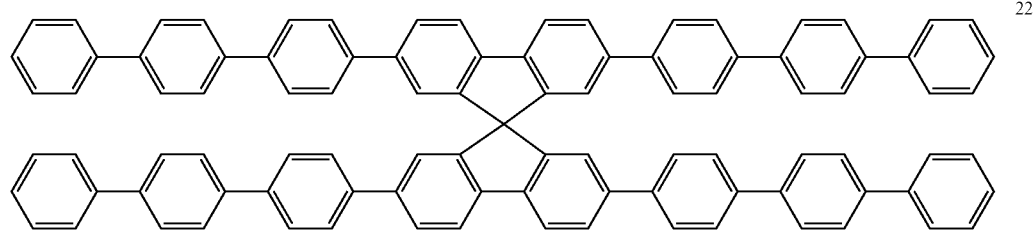

A key feature of the molecules reported by Salbeck et al, are the long arms that disrupt crystallinity and provide conjugation. Luminescent metal complexes having phenyl, biphenyl, terphenyl, or quaterphenyl groups, preferably terphenyl or quaterphenyl groups, will form homogeneous amorphous mixed films with long arm spiro molecules. The aromatic groups on the long arm spiro molecule and the aromatic ligands enhance energy transfer to the metal from the spiro molecule. Spiro molecules, such as 22, may be combined with fluorescent metal complexes, preferably lanthanide complexes, to form glassy films that fluoresce predominantly the color of the fluorescent metal.

The organic matrix of the present invention may be an aromatic matrix, preferably an aromatic hydrocarbon matrix, containing only carbon and hydrogen, and preferably only aromatic rings. The aromatic rings may be phenyl or phenylene, or fused ring structures such as naphthalene, anthracene, phenanthrene and the like. The aromatic hydrocarbon matrix may be composed of discrete molecules (i.e., having molecules of only a single molecular weight) or may be oligomeric or polymeric phenylenes (i.e., having a range of molecular weights). The aromatic hydrocarbon matrix may be spiro structures such as structure 22, or fluorene containing structures such as 9,9-diphenylfluorene. The aromatic hydrocarbon matrix may be a mixture of discrete molecules, oligomers, and/or polymers. The aromatic matrix may be linear or branched. Non-limiting examples of an aromatic matrix are 1,3-di(2-benzoxazole)benzene, 2,4-diphenylquinoline, 2,3-diphenylquinoxaline, 1,4-di(6-iodo-4-phenylquinolinedi-2-yl)benzene, 6,6'-di(2,4-diphenylquinoline), 4,4'-diphenyl-4,4'dipyridyl, triphenyltriazine, N,N,N'N'-tetraphenylbenzidine, poly(4,4'-triphenylamine), tri-1-naphthylamine, polyaniline, poly(N-phenylaniline), poly(2,3-dioctyl-1,4-thiophene), poly(2,3-ethylenedioxy-1,4-thiophene) and the like. Non-limiting examples of discrete aromatic hydrocarbon molecules are terphenyl, 9,9'-diphenylanthracene, pentacene, tetraphenylethylene, triphenylethylene, triphenylmethane, triphenylene, tetraphenylbenzene, and the like. Non-limiting examples of oligomeric or polymeric aromatic hydrocarbon matrices are poly(phenylphenylene), poly(phenyl-1,4-phenylene-co-phenyl-1,3-phenylene), hyperbranched polyphenylene, poly(9,9'-dioctylfluorene), and the like.

The organic matrix may be chosen to be an electron or hole transport material. Such materials will have a high electron mobility, preferably greater than $10^{-6}$ cm²/V-s, more preferably greater than $10^{-5}$ cm²/V-s, and most preferably greater than $10^{-4}$ cm²/V-s.

A function of the matrix, whether polymeric, oligomeric, or small molecule, is to carry charge (holes and/or electrons) and excited state energy (excitons). Aromatic, polarizable molecules will have these properties, to an extent dependent on their conjugation length, and ability to transfer energy through space; e.g., Förster coupling; see e.g., "Electroluminescent Materials," Blasse and Grabmaier, Chapter 5, 1994, Springer-Verlag, which is incorporated herein by this reference.

The effectiveness of a matrix to transfer energy to a metal, or the effectiveness of a ligand to transfer energy from a matrix to a metal may be determined by measurement of spectra. The UV-vis spectrum of the matrix is measured and the extinction coefficient at 354 nm (or other particular wavelength, 354 is used because it is easily obtained from a mercury lamp and is in the near UV) calculated and noted as $E_{matrix}$. $E_{matrix}$ has units of liter/mole-cm. A series of photoluminescence spectra of the matrix plus metal complex is taken at a metal complex concentration of 0.1 wt % metal and the quantum yield at the wavelength maximum in the visible region is calculated for each and noted as $Phi_{complex}$. $Phi_{complex}$ is unitless. The ratio $Phi_{complex}/E_{matrix}$ is the figure of merit F. The figure of merit F has units of mole-cm/liter. Systems with higher F are better than those with lower F. This test may be modified in particular cases, e.g. it may be desired to use lower concentrations of metal complex to avoid concentration quenching or higher concentrations to improve sensitivity. It may be desirable to integrate the photoluminescence intensity over a finite wavelength range instead of using the wavelength at maximum intensity (Note the units will change accordingly). This test measures the combined efficiency of energy transfer from the excited state of the matrix to the metal (through ligand or otherwise) and emission from the excited metal.

The luminescent matrix of the instant invention is useful in electroluminescent (EL) devices. In an EL device an EL material is sandwiched between two electrodes and a voltage applied. Typically, one of the electrodes is a transparent electrode. Examples of transparent electrodes include, but are not limited to, indium tin oxide (ITO), antimony tin oxide, doped metal oxides such as doped zinc oxide, and doped titanium oxide, polyaniline, PEDOT, very thin metal films such as a 50 nm gold film, and combinations of the above.

EL devices may contain additional layers, including, but not limited to hole transport layers (HTL), electron transport layers (ETL), conducting polymer layers (CPL), metal layers, and layers to seal the device from the atmosphere.

The devices may have mixed layers, for example a layer comprising a hole transport material and a luminescent material. Or a layer comprising a hole transport material, a luminescent material and an electron transport material. One skilled in the art will know how to select HTL and ETL materials.

The devices may have graded or gradient layers. That is, the concentration of a hole transport, a luminescent, or an electron transport material may vary with distance from the electrode in a continuous fashion. Graded layers may be prepared by allowing one layer to diffuse into an underlying layer, or by changing the composition of the layer as it is being deposited.

Figure 2:
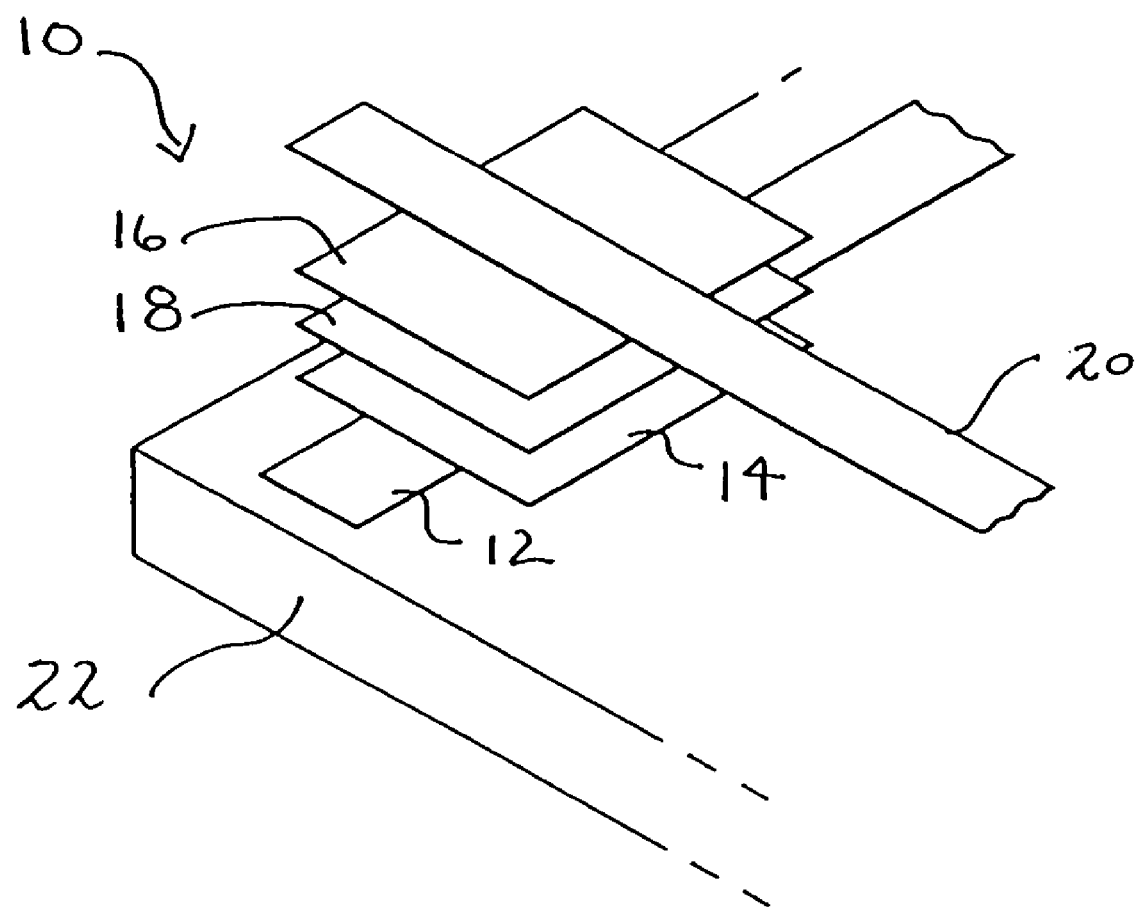
FIG. 2 is a semi-schematic exploded view of the electroluminescent device of FIG. 1.

Turning to FIG. 1, there is shown one embodiment of an electroluminescent device 10 provided in accordance with practice of the present invention. The electroluminescent device 10 includes a transparent conductor 12 which acts as a first electrode. A hole transport layer 14 and an electron transport layer 16 supply holes and electrons, respectively, to an electroluminescent layer 18. A second electrode 20 completes the circuit. The electroluminescent device 10, in this embodiment, is mounted on a substrate 22 which, in some embodiments, can be glass. Other substrates such as plastic can be used if desired. The substrates can be transparent, translucent, or opaque. If the substrate is opaque, the top electrode is preferably transparent. Turning now to FIG. 2, there is shown an exploded view of the electroluminescent device 10 of FIG. 1, where like components are labeled with the reference numerals of FIG. 1.

Figure 3:
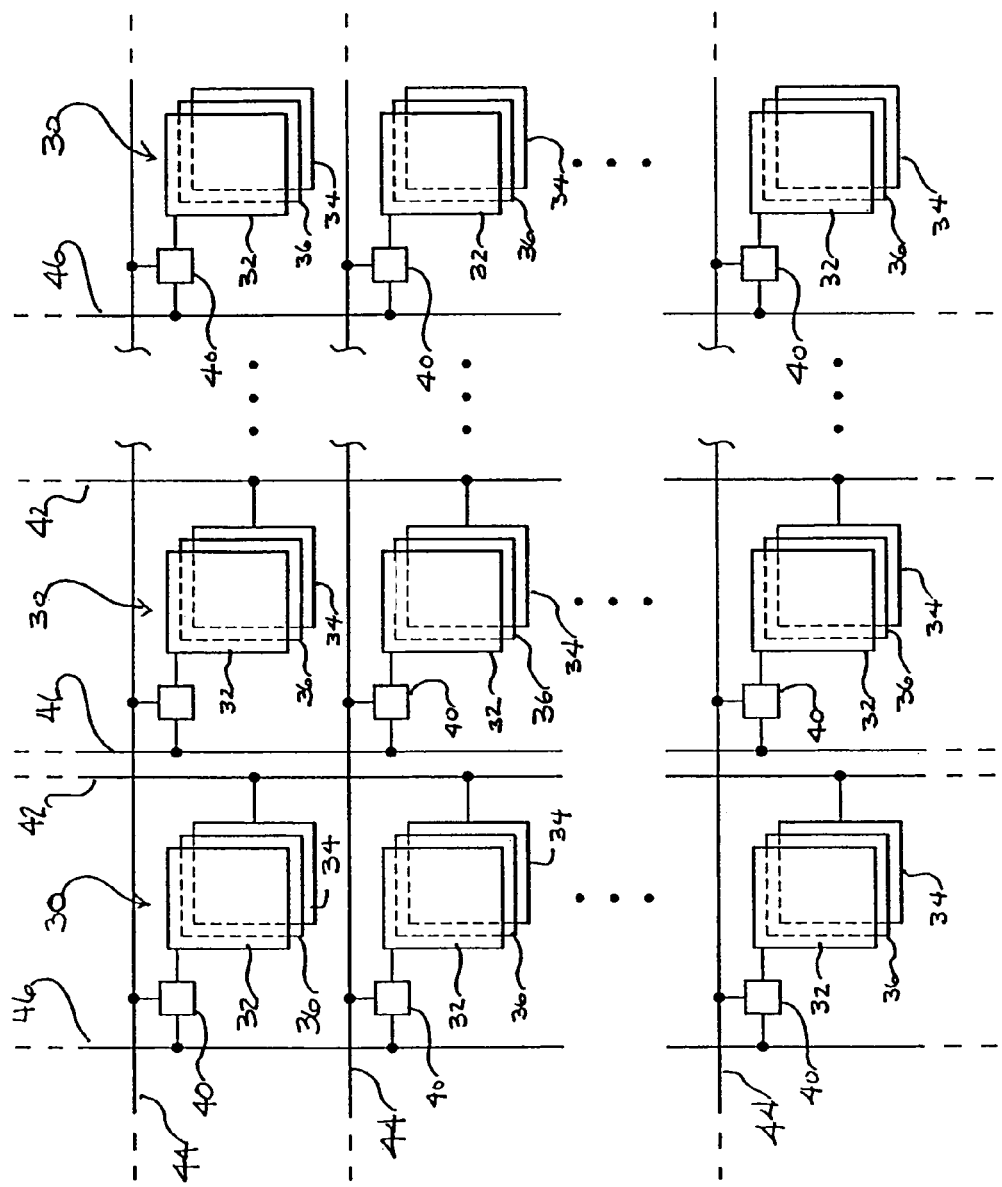
FIG. 3 shows an array of electroluminescent devices extending in two dimensions provided in accordance with practice of the present invention.

Turning to FIG. 3, there is shown an array of cells of electroluminescent devices 30 provided in accordance with practice of the present invention. Each of the electroluminescent devices comprises two electrodes 32 and 34 with an electroluminescent layer 36-sandwiched therebetween. Optionally, a hole transport layer and/or an electron transport layer can be provided on each side of the electroluminescent layer. A driver circuit 40 supplies current to the top electrodes 32. Current-carrying lines 42 are connected to the bottom electrodes 34, and address lines 44 are used to control the current supplied through the driver circuitry 40 and drivelines 46. Each cell may have a different electroluminescent material in the layer 36 to thereby emit a different color. The array shown in FIG. 3 is merely illustrative, and the geometry of the array provided in accordance with the present invention is not limited by the arrangement of the drawing.

Figure 4:
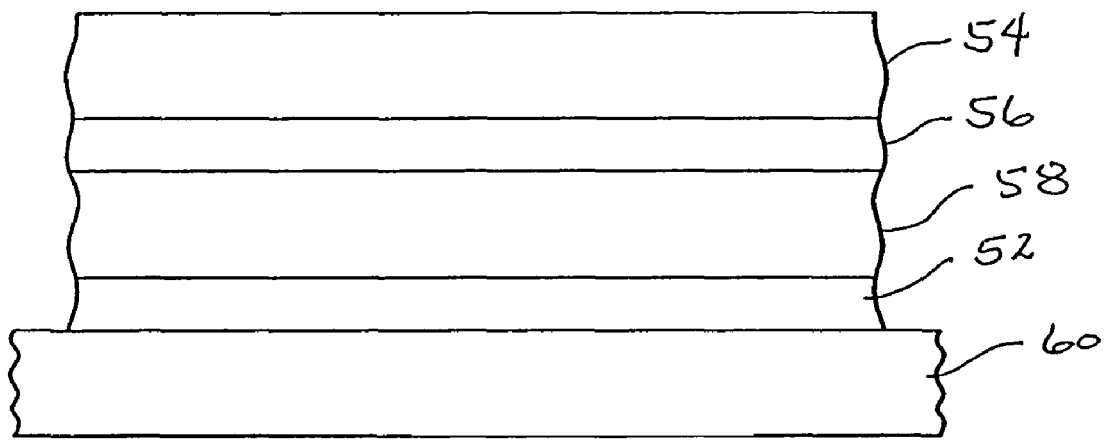
FIG. 4 is a semi-schematic side view of another embodiment of an electroluminescent device provided in accordance with practice of the present invention which comprises an electron transfer layer but no hole transfer layer.

Turning now to FIG. 4, there is shown an electroluminescent device 50 provided in accordance with practice of the present invention which comprises a bottom electrode 52, a top electrode 54, an electron transport layer 56, and an electroluminescent layer 58 mounted on a substrate 60. In this embodiment, there is no hole transport layer, and the electrode 54 supplies current through the electron transport layer 56.

Figure 5:
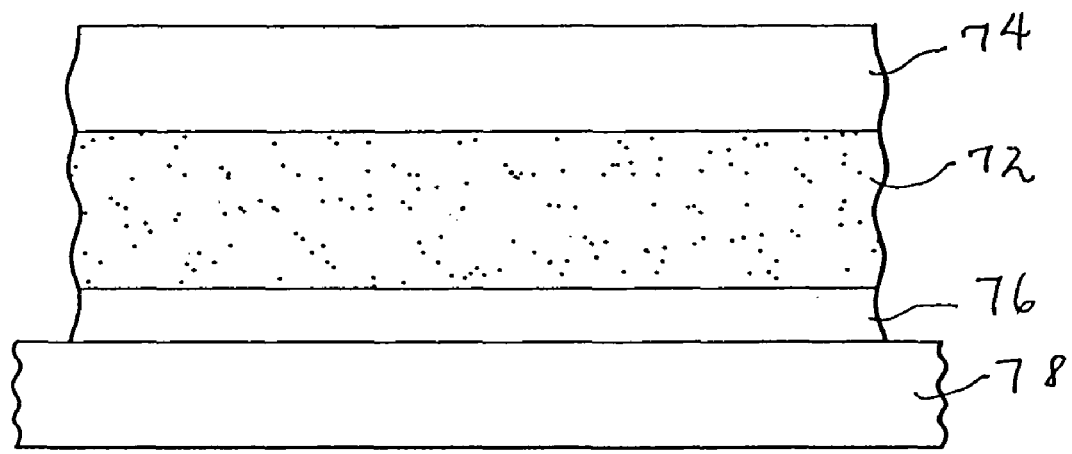
FIG. 5 is a semi-schematic side view of an electroluminescent device provided in accordance with practice of the present invention having a graded electroluminescent layer.

Turning now to FIG. 5, there is shown yet another embodiment of an electroluminescent device 70 provided in accordance with practice of the present invention. The electroluminescent device 70 incorporates a graded electroluminescent layer 72 sandwiched between electrodes 74 and 76. The electroluminescent device 70 is supported on a substrate layer 78. In this embodiment, the graded layer comprises an organic matrix and a luminescent metal ion or luminescent metal complex, and optionally a hole transport material and/or an electron transport material. The concentration of the luminescent metal ion or luminescent metal complex is dependent on position, for example the concentration may be low, or approach zero near the electrodes 74 and 76, and be highest at the center of the layer 72. This arrangement would prevent quenching of luminescence by the electrodes. Similarly, a gradient of hole transport material, e.g. varying approximately linearly from zero near the electrode 74 to the highest near the electrode 76, would aid in hole transport from electrode 76, but not allow holes to reach the electrode 74. Similarly, a gradient of electron transport material from zero near the electrode 76, and highest near the electrode 74, would aid electron transport.

In the absence of an electron transport layer and/or a hole transport layer, the organic matrix comprising the electroluminescent layer must carry electrons and/or holes respectively.

EXAMPLE 1

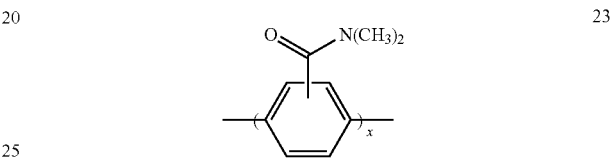

Polymer 23 poly-p-(N,N-dimethylamidophenylene) (10 mg) is prepared (as described in U.S. Pat. No. 5,227,457 Example XV, incorporated herein by reference) by placing dry nickel chloride (60 mg., 0.46 mmol), triphenylphosphine (0.917 g, 3.5 mmol), 2,2'-bipyridine (64.7 mg, 0.41 mmol), sodium iodide (0.39 g, 1.44 mmol), and zinc powder (0.92 g, 14.1 mmol) into a 100 ml round-bottom flask. The flask and its contents are heated to 50° C. for 90 minutes under dynamic vacuum to remove trace water. Evacuation is discontinued, and argon is admitted to the flask. Dry dimethylformamide (DMF) (8 ml) is added, and the temperature is raised to 80° C. Within 5 minutes, the mixture turns a deep-red color. After stirring for 20 minutes under argon, a solution of 2,5-dichloro-N,N-dimethylbenzamide (2.016 g, 9.1 mmol) in DMF (5 ml) is added. After 2 hours, the mixture is cooled to room temperature, then poured into 200 ml of 15% aqueous HCl and extracted with benzene. The product, as a suspension in benzene, is washed with 5% HCl. Dichloromethane is added to the thick, white, benzene suspension to give a slightly cloudy solution, which is separated from the remaining water and taken to dryness on a rotary evaporator to give 0.5 g of poly-p-(N,N-dimethylamidophenylene), a white powder. The polymer 23 was dissolved in 1.5 g N-methyl pyrrolidinone (NMP). Separately 15 mg $EuCl_3 \cdot 6H_2O$ was dissolved in 1.7 g NMP. The solutions were mixed and stirred for two minutes at about 120° C. A portion of this solution was cast onto a microscope slide on a hot plate in air at 120-130° C. An essentially dry film was obtained after a few minutes. Upon exposure of this film to long wavelength UV radiation (~366 nm) red luminescence was observed. As a standard reference, 15 mg of polymer 23 was dissolved in 1.2 g NMP and cast as above. Upon exposure to long wavelength UV radiation, bright blue luminescence was observed. The red luminescence of the polymer 23/$Eu^{3+}$ film diminished when placed in air for an extended period of time. A drop of water was placed on the film. The region of the film contacted by water fluoresced blue.

EXAMPLE 2

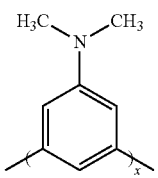

Structure 24

Poly(1,3-(5-dimethylamino)phenylene), 24

To N,N-dimethyl-3,5-dichloroaniline (1.90 grams, 0.01 mol) in anhydrous NMP (50 ml) is added nickel(bistriphenylphosphine)dichloride (0.109 g, 0.167 mmol), sodium bromide (0.103 g, 1 mmol), and triphenylphosphine (0.262 g, 1 mmol), and zinc dust (1.96 g 0.03 mol) under nitrogen. On addition of zinc the reaction mixture warms. The temperature is held between 70° C. and 85° C. using a cooling or heating bath as needed, for 4 hours. The reaction mixture is then cooled to below 50° C. and poured into 100 ml of isopropanol. The coagulated polymer is filtered and re-dissolved in NMP. The solution is filtered to remove zinc, and coagulated a second time into isopropanol. The coagulated polymer is filtered and dried.

Polymer 24 poly(1,3-(5-dimethylamino)phenylene) (12 mg) is dissolved in 1.2 g NMP. 10 mg $EuCl_3.6H_2O$ is dissolved in 1.2 g NMP. Half of each solution is mixed together and cast as in Example 1. The other half of polymer PP3 solution is separately cast and dried. Upon exposure to long wavelength UV radiation, the film of pure PP3 luminescence blue while the film of the PP3/$Eu^{3+}$ does not luminesce.

EXAMPLE 3

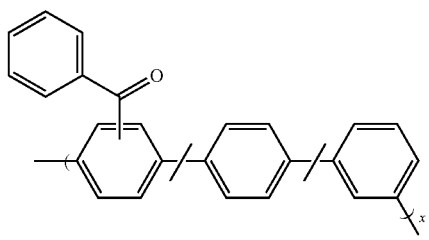

Structure 25

Poly(2,5-benzophenone-co-1,4-phenylene-co-1,3-phenylene), 25

The following compounds were added to a round bottom flask under a nitrogen purge: 2,5-dichlorobenzophenone (1.51 grams, 6.00 mmol), 1,4-dichlorobenzene (0.88 gram, 6.00 mmol), 1,3-dichlorobenzene (7.06 ml, 48 mmol), NMP (53.9 ml), NaI (0.84 gram, 5.60 mmol), triphenylphosphine (3.15 gram, 13.6 mmol), nickelbistriphenylphosphinedichloride (0.523 gram, 0.800 mmol), and Zn dust (5.6 gram, 85.6 mmol). The reaction was heated in an oil bath set to 65° C. The temperature of the reaction mixture increased to 81.1° C. and then returned to 65° C. The reaction mixture was held at 65° C. overnight, after which time the mixture was coagulated into a mixture of ethanol and concentrated hydrochloric acid. The coagulated polymer was washed with hot ethanol and hot acetone and dried. The weight average molecular weight was determined to be 32,333 by gel permeation chromatography (GPC). The yield was 5.265 grams of polymer 25 indicating that some impurities were still present in the coagulated polymer. Films were cast from hot NMP. The films fluoresce blue under long wave ultraviolet irradiation.

Polyphenylene polymer 25 20 (mg) is dissolved in 1.5 g NMP. Separately, 10 mg $EuCl_3.6H_2O$ is dissolved in 1.2 g NMP. The solutions are mixed and cast as in Example 1. Upon exposure to UV radiation (366 nm) the typical blue luminescence of polymer 25 is observed with no observable diminution in strength or shift in color due to the addition of europium salt.

In Examples 1 and 2, and most notably Example 1, the color of luminescence of the mixture was altered from the blue color of the host polymer, most probably due to energy transfer from the excited state of the polymer to the rare earth metal and the subsequent emission from the metal ion. The red emission in Example 1 indicates emission only from the excited $Eu^{3+}$ ions and the transfer of energy from the excited state of 23 to the $Eu^{3+}$ ions.

Complexation or coordination of the rare earth ion and the polymer appears to be important for energy transfer. Polymers 23 and 24 contain amide and amine moieties in their structure while polymer 25 is purely a hydrocarbon. Complexation of the nitrogen or oxygen containing polymers seems to facilitate energy transfer. In Example 3, Polymer 25 does not contain groups that interact strongly with the europium ion and thus interaction and energy transfer did not take place. In Example 2 polymer 24 has an amine side group which may coordinate to a metal ion. Energy was transferred from the polymer as indicated by quenching of polymer luminescence, however, luminescence of the europium is not observed, indicating that other factors may cause quenching of the rare earth luminescence.

EXAMPLE 4

Polyfluorene 26

9,9-di-n-butyl-2,7-dibromofluorene 27 is prepared by the method of Woo, et al, U.S. Pat. No. 5,962,631 the relevant parts of which are incorporated herein by reference. The GPC molecular weight of the polymer 27 is 50,000 to 60,000.

To 27 (4.36 grams, 0.01 mol) in anhydrous NMP (50 ml) is added nickel(bistriphenylphosphine)dichloride (0.109 g, 0.167 mmol), sodium bromide (0.103 g, 1 mmol), and triphenylphosphine (0.262 g, 1 mmol), and zinc dust (1.96 g, 0.03 mol) under nitrogen. On addition of zinc the reaction mixture warms. The temperature is held between 70° C. and 85° C. using a cooling or heating bath as needed, for 4 hours. The reaction mixture is then cooled to below 50° C. and poured into 100 ml of isopropanol. The coagulated polymer is filtered and redissolved in NMP. The solution is filtered to remove zinc, and coagulated a second time into isopropanol. The coagulated polymer 26 is filtered and dried.

EXAMPLE 5

Polyfluorene Copolymer 28

9,9-di-n-butyl-2,7-dibromofluorene 27 is prepared as above by the method of Woo, et al, U.S. Pat. No. 5,962,631.

2,7-dibromofluorene-9-spiro-2'-(1',3',6',9',12',15'-hexaoxacycloheptadecane), 29

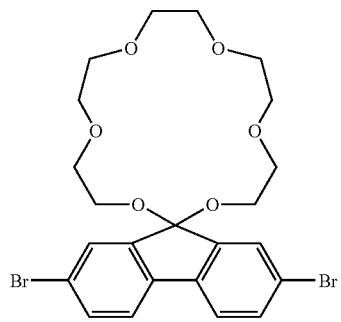

To a solution of 2,7-dibromo-9-fluoreneone (33.8 grams, 0.1 mol) in toluene (250 ml), is added penta(ethylene glycol) (23.8 grams, 0.1 mol), and DOWEX® 50WX4-100 ion-exchange resin (5 grams). The mixture is gently refluxed for 8 hours in a dean-stark apparatus to remove water, after which time the mixture is cooled to room temperature and the ion-exchange resin is filtered off. The solvent is removed by distillation at reduced pressure using a rotary evaporator. The resulting product may be used as is or purified by column chromatography.

Alternatively, the crown ether 29 may be prepared following the method of Oshima et al, Bull. Chem. Soc. Japan, 59, 3979-3980, except replacing 9-fluoreneone with 2,7-dibromo-9-fluoreneone.

To 29 (5.58 grams, 0.01 mol) in anhydrous NMP (50 ml) is added 27 (4.36 grams, 0.01 mol), nickel(bistriphenylphosphine)dichloride (0.109 g, 0.167 mmol), and triphenylphosphine (0.262 g, 1 mmol), and zinc dust (1.96 g, 0.03 mol) under nitrogen. On addition of zinc the reaction mixture warms. The temperature is held between 70° C. and 85° C. using a cooling or heating bath as needed, for 4 hours. The reaction mixture is then cooled to below 50° C. and poured into 100 ml of isopropanol. The coagulated polymer 28 is filtered and redissolved in NMP. The solution is filtered to remove zinc, and coagulated a second time into isopropanol. The coagulated polymer is filtered and dried.

EXAMPLES 6-8

Polyfluorene Type Fluorophors

Polyfluorene 28 (10.0 grams) and a metal salt as indicated in Table 1 are dissolved in 100 ml NMP. The solution is spin-coated onto an ITO coated glass substrate to a thickness of about 100 nm. The coated substrate is dried at 100° C. at reduced pressure for 3 hours. The films fluoresce as indicated in Table 1 when irradiated at 366 nm. An aluminum layer of a thickness of about 200 nm is evaporated onto the polymer/metal salt film at about $10^{-6}$ torr. Connections were made to the ITO and aluminum layer with indium-tin solder. A potential is applied to the films with ITO positive and aluminum negative (forward bias), causing the devices to emit light of a color corresponding to the photoluminescence.

TABLE 1

| Example | Metal Salt | Weight | Moles | Luminescence |
|---|---|---|---|---|
| Example 6 | Tb(NO$_3$)$_3$.5H$_2$O | 4.35 grams | 0.01 mol | Green |
| Example 7 | Ce(NO$_3$)$_3$.6H$_2$O | 4.34 grams | 0.01 mol | Blue |
| Example 8 | Eu(NO$_3$)$_3$.5H$_2$O | 4.28 grams | 0.01 mol | Red |

EXAMPLES 9-11

Films of Polyfluorene and a Polarizable Fluorescent Metal Complex

Polyfluorene 28 (10.0 grams), and a metal complex as indicated in Table 2 (dbm is dibenzoylmethane) are dissolved in 100 ml NMP. The solution is spin-coated onto an ITO coated glass substrate to a thickness of about 100 nm. The coated substrate is dried at 100° C. at reduced pressure for 3 hours. The films fluoresce as indicated in Table 2 when irradiated at 366 nm. An aluminum layer of a thickness of about 200 nm is evaporated onto the polymer/metal salt film at about $10^{-6}$ torr. The area covered by the aluminum is controlled using a mask of 1 cm$^2$ open area. Connections were made to the ITO and aluminum layer with indium-tin solder. A potential is applied to the films with ITO positive and aluminum negative (forward bias), causing the devices to emit light of a color corresponding to the photoluminescence.

TABLE 2

| Example | Metal Complex | Weight | Moles | Luminescence |
|---|---|---|---|---|
| Example 9 | Eu(dbm)$_3$ | 8.25 grams | 0.01 mol | Red |
| Example 10 | Tb(dbm)$_3$ | 8.32 grams | 0.01 mol | Green |
| Example 11 | Ce(dbm)$_3$ | 8.13 gram | 0.01 mol | Blue |

EXAMPLE 12

Europium doped yttria, Y$_2$O$_3$:Eu (100 grams) (Superior MicroPowders, Albuquerque, N. Mex.) is added to a solution of polymer 23 (100 grams) in NMP (1 liter). The suspension is mixed well and films are cast onto ITO coated glass substrates to give films of thickness of about 2 microns. An aluminum contact is evaporated onto the film through a mask to cover a 1-cm square section of the film. Under forward bias the film emits red light.

EXAMPLES 13-16

Nanocrystalline Phosphor/Polymer Matrix Type Electroluminescent Systems

Nanocrystalline phosphors are prepared according to Ihara et al, as reported in Society for Information Display, International Symposium, 1999. The average particle size is 2 to 3 nanometers. Ten grams of nanocrystalline phosphor is added to 5 grams of polymer 26 (or polymer 23) in 50 ml of NMP. The resulting suspensions are spin cast onto ITO coated glass plates to form thin films between 100 and 500 nanometers. The films fluoresce (PL) under 366-nm irradiation as tabulated in Table 3. The films are then coated with aluminum by vacuum evaporation through a mask with a 5-mm by 10-mm hole. A voltage of 5 to 10 V is applied across the device with the ITO electrode being positive causing electroluminescence (EL) as listed in Table 3.

TABLE 3

| Example | Nanocrystal | Polymer | PL | EL |
| --- | --- | --- | --- | --- |
| Example 13 | ZnS:Eu | 26 | Red | Red |
| Example 14 | ZnS:Tb | 26 | Green | Green |
| Example 15 | ZnS:EuF$_3$ | 23 | Red | Red |
| Example 16 | ZnS:TbF$_3$ | 26 | Green | Green |

EXAMPLES 17-20

Polymer/Rare Earth Metal Complexes

Energy transfer between an aromatic polymer and lanthanide ions was qualitatively examined. NMP was used as co-solvent for all mixtures from which films were cast and dried at around 100° C. in air. Dilute and approximately equivalent concentration solutions of all species were made in NMP. Desired solution mixtures were then prepared by mixing of equivalent amounts of the polymer and metal salt solutions. Films were prepared by casting these solution mixtures onto slides and drying in air at ~100° C. using a hot plate. The dried films were then excited with long wave UV radiation (366 nm) and the luminescence observed. Table 4 shows the luminescence properties of the starting materials. Table 5 summarizes the results for the mixtures.

TABLE 4

| Material | Phase | Luminescence/Color | Comments |
| --- | --- | --- | --- |
| 25 | Solid | Blue | Hazy film |
| 23 | Solid | Blue | Clear film |
| 24 | Solid | Blue | Clear brownish |
| EuCl$_3$ | Solution | Red | Clear solution |
| TbCl$_3$ | Solution | Green | Clear solution |

TABLE 5

| Example # | Mixtures | Phase | Luminescence/Color | Comments |
| --- | --- | --- | --- | --- |
| 17 | 25 + Eu$^{3+}$ | Solid | Blue | Hazy film |
| 18 | 23 + Eu$^{3+}$ | Solid | Red | Clear film |
| 19 | 24 + Eu$^{3+}$ | Solid | None | Clear brownish |
| 20 | 23 + Tb$^{3+}$ | Solid | Weak Blue | Clear |

In Examples 18, 19, and 20 the color of the film fluorescence is altered away from the blue color of the sensitizer or host polymer, most probably due to energy transfer from the excited state of the polymer to the rare earth metal and the subsequent emission from the lattice of the metal ion. This was most pronounced in Example 18 where the red color indicated emission only from the excited Eu$^{3+}$ ions and the transfer of energy from the excited state of polymer 23 to the Eu$^{3+}$ ions. In example 19 the fluorescence of the polymer was quenched indicating energy transfer, however, the Eu fluorescence in the red was too weak to be visible. In Example 20, the weak blue fluorescence indicated only partial energy transfer to Tb, and the green color of Tb fluorescence was not observed. In this set of experiments the N,N-dimethylamido groups of polymer 23 was most effective at transferring energy to Eu$^{3+}$.

EXAMPLE 21

Crosslinked Matrix

The bisglycidylether of 4,4'-biphenyl is mixed with 20 mole % of 1-naphthylamine, 500 mole % anisole, and 2 mole % of Eu(acac)$_3$. Optionally, 10 to 50 mole % of a polymer of structures I through XII is added. The mixture is cast into a film and heated to 80° C. under reduced pressure causing simultaneous evaporation of anisole and curing of the epoxy groups. The cured film fluoresces red.

EXAMPLE 22

Photocrosslinked Matrix

Monomers 1-vinylnaphthalene (0.1 mol) and divinylbenzene (0.005 mol), photoinitiator (0.001 mol), and tris(8-hydroxyquinolinato)terbium, are mixed and cast as a thin film by spin coating onto an ITO coated glass substrate. The film is immediately exposed to 254 nm light to activate the photoinitiator. The film is then heated to 100° C. for 5 min to remove unreacted monomer. The film fluoresces green. A second electrode of aluminum is deposited onto the luminescent layer by sputtering.

EXAMPLE 23

Photocrosslinked Matrix

The same as example 22, except that polystyrene (0.05 mol) is added to the mixture before spin coating to adjust the viscosity of the mixture.

EXAMPLE 24

Small Molecule Matrix-Spiro Compound Matrix

The spiro compound 22 (0.1 mol) is dissolved in a mixture of toluene (50 ml) and tetrahydrofuran (50 ml) and tris(benzoylnaphthoylmethane)terbium (0.05 mol) and polystyrene (0.01 mol) are added. The resulting mixture is spin coated onto the top of a multilayer structure consisting of glass, ITO, and tris(4-phenylethynylphenyl)amine cured at 300° C. for 1 hour under nitrogen (50 nm). The resulting multilayer structure fluoresces green. A top electrode is formed by evaporation of aluminum.

Tris(4-phenylethynylphenyl)amine

Tri(4-bromophenyl)amine (0.1 mol) and phenylacetylene (0.3 mol) are allowed to react in NMP (100 ml) with palladiumdiacetate (0.006 mol), tritolylphosphine (0.012 mol) and triethylamine 0.3 mol) at 80° C. for 16 hours. The triethylammonium bromide is filtered off and the product is purified by recrystalizaton from hexane.

EXAMPLE 25

Monomer 27 (9,9-di-n-butyl-2,7-dibromofluorene) (43.6 gram, 0.1 mol) and 2,7-dibromo-9-fluoreneone (8.45 grams, 0.025 mol) are polymerized using the conditions of Example 5 to give copolymer 30 having the following structure:

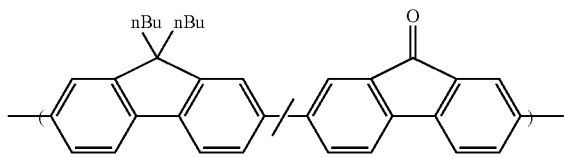

A film is cast from a solution of 30 (1 gram) and europiumtrichloride hydrate (0.1 gram) in NMP (10 ml). The film fluoresces red.

EXAMPLE 26

Film Containing Hole Transport Agent

The method of Example 1 is repeated except that N,N'-diphenyl-N,N'-bis(3-methylphenyl)-(1,1'-biphenyl)-4,4'diamine (TPD) 5 mg is added to the first solution in addition to polymer 23. The resulting film has a red fluorescence when irradiated at 366 nm.

EXAMPLE 27

Poly(para-benzoylmorpholine) 31 is prepared (as described in U.S. Pat. No. 5,227,457 Example XVII incorporated herein by reference) by placing anhydrous nickel(II) chloride (50 mg, 0.39 mmol), triphenylphosphine (750 mg, 2.86 mmol), sodium iodide (150 mg, 1.0 mmol), and 325 mesh activated zinc powder (1.2 g, 18 mmol) into a 25 ml flask under an inert atmosphere along with 5 ml of anhydrous N-methyl-pyrrolidinone (NMP). This mixture is stirred at 50° C. for about 10 minutes, leading to a deep-red coloration. A solution of 3 g (11.5 mmol) of 2,5-dichlorobenzoylmorpholine (>99% pure by HPLC analysis) in 10 ml of anhydrous NMP is then added by syringe. After stirring for about 60 hours, the resulting highly viscous solution is poured into 100 ml of 1 molar hydrochloric acid in ethanol to dissolve the excess zinc metal and to precipitate the polymer. This suspension is filtered, and the precipitate triturated with acetone to afford, after isolation and drying, 2.2 g (100% yield) of polyparabenzoylmorpholine as a light tan powder. The inherent viscosity is about 1.8 dL/g. Polymer 31, 10 mg, is dissolved in 1.5 g NMP. Separately, 15 mg Eu(NO3)3.6H2O and 6 mg phenanthroline are dissolved in 1.5 g NMP. The solutions are mixed and stirred for two minutes at 120° C. A portion of the solution is cast onto a glass plate at 120-130° C., and kept hot until dry, and then cooled to room temperature. On exposure to 366 nm UV radiation, red luminescence is observed. A film prepared similarly from a solution containing polymer 31 alone fluoresces blue.

EXAMPLE 28

Copoly-{1,4-(benzoylphenylene)}-{1,4-phenylene}32 is prepared (as described in U.S. Pat. No. 5,227,457 Example XVII incorporated herein by reference) by placing anhydrous bis(triphenylphosphine) nickel(II) chloride (3.75 g; 5.7 mmol), triphenylphosphine (18 g; 68.6 mmol), sodium chloride (2.0 g, 34.2 mmol), 325 mesh activated zinc powder (19.5 g; 298 mmol), and 250 mL of anhydrous NMP into an oven dried 1-liter flask under an inert atmosphere. (Activated zinc powder is obtained after 2-3 washings of commercially available 325 mesh zinc dust with 1 molar hydrogen chloride in diethyl ether (anhydrous) and drying in vacuo or under inert atmosphere for several hours at about 100°-120° C. The resulting powder should be sifted (e.g. a 150 mesh sieve seems to be satisfactory), to remove the larger clumps that sometimes form, to assure high activity. This material should be used immediately or stored under an inert atmosphere away from oxygen and moisture) this mixture is stirred for about 15 minutes, leading to a deep-red coloration. A mixture of 2,5-dichlorobenzophenone (45 g; 179 mmol) and 1,4-dichloro-benzene (2.95 g; 20 mmol) is then added to the flask. The temperature of the vigorously stirred reaction mixture is held at 60°-70° C. until the mixture thickens (about 30 minutes). After cooling the reaction mixture to room temperature overnight, the resulting viscous solution is poured into 1.2 L of 1 molar hydrochloric acid in ethanol to dissolve the excess zinc metal and to precipitate the polymer. This suspension is filtered and the precipitate is washed with acetone and dried to afford crude resin. The achieve high purity, the crude polymer is dissolved in about 1.5 L of NMP and coagulated into about 4 L of acetone, continuously extracted with acetone, and dried to afford 30 g (89% yield) of an off-white powder. The intrinsic viscosity is 4.2 dL/g in 0.05 molar lithium bromide in NMP at 40° C.

Polymer 32, 1.3 g is reduced using sodium borohydride (1.1 molar equivalent of sodium borohydride for each benzoyl group of 32) in phenethylalcohol, to give polymer 33. Polymer 33 is treated with an excess of acetic anhydride to esterify the alcohol groups resulting from the sodium borohydride reduction, to give polymer 34.

A layer of polymer 34 (about 300 nm thick) is spin cast onto a glass substrate coated with an indium tin oxide transparent conductive layer, which has been coated with Baytron P® (Bayer) of thickness about 500 nm. A layer of calcium is evaporated on top of the layer of polymer 34 as a cathode. Finally, a layer of magnesium is evaporated on top of the calcium to protect the calcium from air. When a voltage is applied between the indium tin oxide anode and the calcium cathode, blue light is emitted.

EXAMPLE 29

Copoly-{1,4-(benzoylphenylene)}-{1,3-phenylene} 35 is prepared (as described in U.S. Pat. No. 5,654,392 Example 16 incorporated herein by reference) by placing anhydrous bis (triphenylphosphine) nickel(II) chloride (10 g; 15 mmol), triphenylphosphine (50 g; 0.19 mole), sodium iodide (15 g; 80 mmol), and 325 mesh activated zinc powder (60 g; 0.92 mole) into a bottle under an inert atmosphere and added to an oven dried 2-liter flask containing 800 milliliters of anhydrous NMP, against a vigorous nitrogen counterflow. This mixture is stirred for about 15 minutes, leading to a deep-red coloration. A mixture of 2,5-dichlorobenzophenone (127 g: 0.51 Mole) and 1,3-dichlorobenzene (11 ml; 96 mmol) is then added to the flask. After an initial slight endotherm (due to dissolution of monomer), the temperature of the vigorously stirred reaction mixture warms to about 80°-85° C. over 30 minutes. After stirring for an additional 10-15 minutes, the viscosity of the reaction mixture increases drastically and stirring is stopped. After cooling the reaction mixture to room temperature overnight, the resulting viscous solution is poured into 6 L of 1 molar hydrochloric acid in ethanol to dissolve the excess zinc metal and to precipitate the polymer. This suspension is filtered, and the precipitate is continuously extracted with ethanol and then with acetone and dried to afford 93 g (94% yield) of crude white resin. To achieve high purity, the crude polymer is dissolved in about 600 mL of methylene chloride, pressure filtered through 1.2 micron (nominal) polypropylene fiber filters, coagulated into about 2 liters of acetone, continuously extracted with acetone, and dried to afford 92 g (93% yield) of a fine white powder. The GPC MW relative to polystyrene is 150,000-200,000.

Polymer 35, 2 g is reduced using sodium borohydride (2 molar equivalent of sodium borohydride for each benzoyl group of 35) in phenethylalcohol to give polymer 36. Polymer 36 is treated with an excess of acetic anhydride to esterify the alcohol groups resulting from the sodium borohydride reduction to give polymer 37. Polymer 37 has a GPC MW of 150,000-200,000 relative to polystyrene. Polymer 37 fluoresces blue when irradiated at 366 nm. A layer of polymer 36 (about 250 nm thick) is spin cast onto a glass substrate coated with an indium tin oxide transparent conductive layer, which has been coated with Baytron P® (Bayer) of thickness about 500 nm. A layer of calcium is evaporated on top of the layer of polymer 36 as a cathode. Finally, a layer of magnesium is evaporated on top of the calcium to protect the calcium from air. When a voltage is applied between the indium tin oxide anode and the calcium cathode, blue light is emitted.

EXAMPLE 30

Polymer 37 as prepared in Example 28 above, 1 g, is mixed with 0.4 g $Eu(NO_3)_3$, $6H_2O$ and 0.15 g phenanthroline in 15 ml NMP. This solution is spin cast onto glass plates precoated with indium tin oxide and Baytron P® Bayer to give a film of about 200 nm thick. The film fluoresces red when irradiated at 366 nm. A magnesium/silver cathode is evaporated on top of the polymer 37 layer on one of the plates. On a second plate, a 100 nm layer of 2,4-dinaphthyloxodiazole is evaporated onto the layer of polymer 37, followed by evaporation of a magnesium/silver cathode. Both devices emit red light when a voltage is applied across the anode and cathode.

The above descriptions of exemplary embodiments of photoluminescent and electoluminescent compositions, the process for producing such compositions, and the photoluminescent and electroluminescent devices produced thereby are for illustrative purposes. Because of variations which will be apparent to those skilled in the art, the present invention is not intended to be limited to the particular embodiments described above. The scope of the invention is defined in the following claims:

What is claimed is:

1. A composition comprising a polymer comprising repeat units selected from the group consisting of:

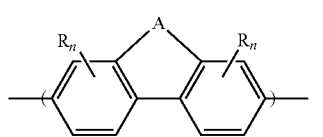

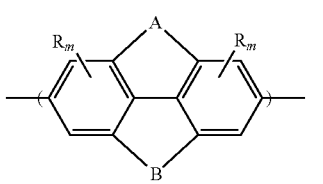

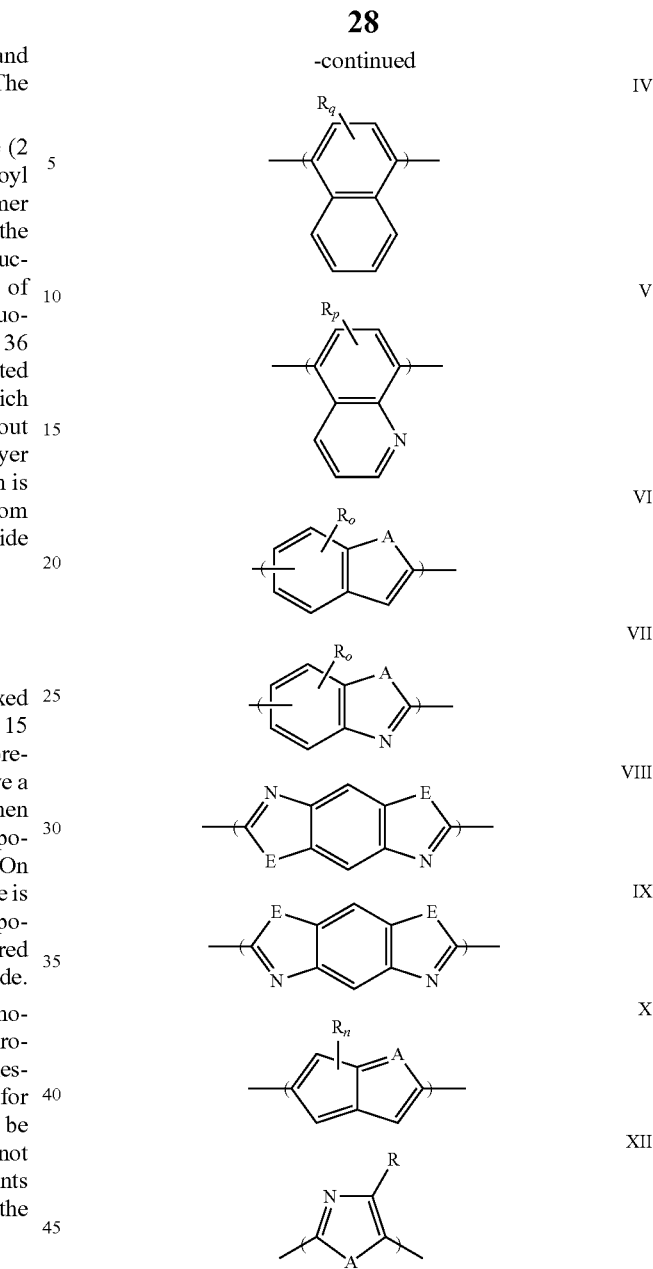

where R is independently selected from H, D, F, alkoxy, aryloxy, alkyl, aryl, alkyl ketone, aryl ketone, alkylester, arylester, amide, carboxylic acid, fluoroalkyl, fluoroaryl, polyalkyleneoxy, any two of the R groups may be bridging, A and B are independently selected from the group consisting of —O—, —S—, —$NR_1$—, and —$CR_1R_2$—, —$CR_1R_2CR_3R_4$—, —N=$CR_1$—, —$CR_1$=$CR_2$—, —N=N—, and —(CO)—, where $R_1$-$R_4$ are H, D, F, alkyl, aryl, alkyleneoxy, polyalkyleneoxy, alkoxy, aryloxy, fluoroalkyl, and fluoroaryl, two of the $R_1$-$R_4$ groups may be bridging within the repeat unit, m is 0-2, n is 0-3, o is 0-4, p is 0-5, q is 0-6, and E is selected from the group consisting of O, NH, and S; and one or more luminescent metal ions or luminescent metal ion complexes, wherein the excited state of the polymer is at a higher energy level than the excited state of the luminescent metal ions or luminescent metal ion complexes.

2. The composition of claim 1, wherein the luminescent metal ion or luminescent metal ion complex comprises a lanthanide metal ion.

3. The composition of claim 2, wherein the polymer is a copolymer.

4. The composition of claim 1, wherein the polymer is a copolymer.

5. The composition of claim 1, wherein the polymer is a dendritic or hyperbranched polymer.

6. The composition of claim 1, wherein the luminescent metal ion or luminescent metal ion complex comprises cerium.

7. The composition of claim 1, wherein the luminescent metal ion or luminescent metal ion complex comprises europium.

8. The composition of claim 1, wherein the luminescent metal ion or luminescent metal ion complex comprises terbium.

9. The composition of claim 1, wherein the luminescent metal ion or luminescent metal ion complex is present as part of an inorganic solid.

10. The composition of claim 9, wherein the inorganic solid is a nanosized powder with physical dimensions in the 1 to 1000 nanometer range.

11. The composition of claim 10, wherein the inorganic solid is a semiconductor.

12. The composition of claim 11, wherein the semiconductor is a II-VI semiconductor.

13. The composition of claim 9, wherein the inorganic solid is a semiconductor.

14. The composition of claim 13, wherein the semiconductor is a II-VI semiconductor.

15. The composition of claim 1, wherein the luminescent metal ion or luminescent metal ion complex comprises a metal ion selected from the group consisting of chromium, manganese, iron, cobalt, molybdenum, ruthenium, rhodium, palladium, silver, tungsten, rhenium, osmium, iridium, platinum, gold, and uranium.

16. An electroluminescent device comprising the composition of claim 15.

17. The composition of claim 1 having emission bands of 20 nm or less.

18. The composition of claim 1 having emission bands of 10 nm or less.

19. The composition of claim 1 having emission bands of 5 nm or less.

20. The composition of claim 1 having emission bands of 3 nm or less.

21. The composition of claim 1, wherein the luminescent metal ion or luminescent metal ion complex comprises a polarizable ligand.

22. The composition of claim 21, wherein the polarizable ligand is selected from the group consisting of

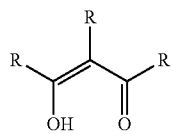

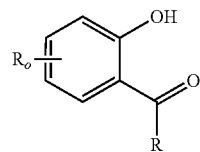

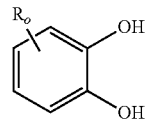

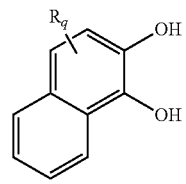

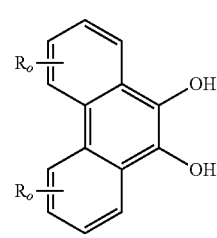

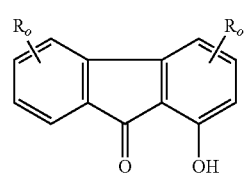

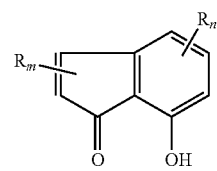

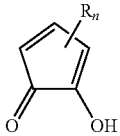

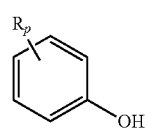

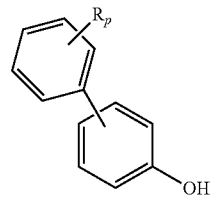

where R in the polarizable ligand is independently selected from H, D, F, Cl, Br, I, alkoxy, aryloxy, alkyl, aryl, alkyl ketone, aryl ketone, alkylester, arylester, amide, carboxylic acid, fluoroalkyl, fluoroaryl, polyalkyleneoxy, any two of the R groups may be bridging, and where in the polarizable ligand each m is 0-2, n is 0-3, o is 0-4, p is 0-5, q is 0-6, r is 0-7, and s is 0-8.

23. The composition of claim 21, wherein the polarizable ligand is covalently attached to a polymer chain.

24. The composition of claim 23, wherein the polymer chain is a conjugated polymer chain.

25. The composition of claim 21, wherein the polarizable ligand interacts with the polymer by non-covalent interaction.

26. The composition of claim 1, wherein the polymer is a crosslinked polymer.

27. The composition of claim 1, wherein the polymer is an oligomer.

28. The composition of claim 1, wherein the polymer is a branched polymer.

29. The composition of claim 1, wherein the polymer is a block co-polymer.

30. The composition of claim 1, wherein the polymer is a random co-polymer.

31. The composition of claim 1, wherein the polymer is a graft co-polymer.

32. The composition of claim 1, wherein the conjugation length of the polymer is controlled with non-aromatic spacer groups.

33. The composition of claim 32, wherein the spacer groups are selected from the group consisting of —O—, —S—, —NR—, —CR$_1$R$_2$—, (CH$_2$)$_n$—, —(CF$_2$)$_n$—, ester, and amide.

34. The composition of claim 33, wherein the conjugation length is between 3 and 6 conjugated rings.

35. The composition of claim 32, wherein the conjugation length is between 2 and 50 conjugated rings.

36. The composition of claim 32, wherein the conjugation length is between 3 and 10 conjugated rings.

37. An electroluminescent device comprising the composition of claim 1.

38. The electroluminescent device of claim 37, wherein the polymer is a crosslinked polymer.

39. The device of claim 37, wherein the composition is cast into a film by spin coating.

40. The device of claim 37, wherein the composition is printed by screen-printing or ink jet printing.

41. An electroluminescent device comprising:
a first electrode;
one or more charge transport materials; and
an electroluminescent layer comprising the composition of claim 1 and a second electrode.

42. The electroluminescent device of claim 41, wherein one or both of said electrodes is a transparent electrode.

43. The electroluminescent device of claim 41, wherein one or both of said electrodes comprises tin oxide or doped tin oxide.

44. The electroluminescent device of claim 41, wherein one of the charge transport materials is a hole transport material provided as a distinct layer.

45. The electroluminescent device of claim 41 comprising two layers;
a first layer comprising a hole transport material, and the electroluminescent layer which comprises an electron transport material.

46. The electroluminescent device of claim 41, wherein an electron transport material is provided as a distinct layer.

47. The electroluminescent device of claim 41 comprising two layers;

a first layer comprising an electron transport material, and the electroluminescent layer which comprises a hole transport material.

48. The electroluminescent device of claim 41 comprising three layers, the electroluminescent layer sandwiched between a layer of electron transport material and a layer hole transport material.

49. The electroluminescent device of claim 48, wherein the layers are not distinct, but graded.

50. The electroluminescent device of claim 41 comprising a hole transport material and an electron transport material both of which are graded in the electroluminescent layer.

51. The electroluminescent device of claim 41, wherein the emission bands are 20 nm or less.

52. The electroluminescent device of claim 41, wherein the emission bands are 10 nm or less.

53. The electroluminescent device of claim 41, wherein the emission bands are 5 nm or less.

54. The electroluminescent device of claim 41, wherein the emission bands are 3 nm or less.

55. The electroluminescent device of claim 41, wherein the electroluminescent layer comprises a nanosized powder with physical dimensions in the 1 to 1000 manometer range.

56. The electroluminescent device of claim 41, wherein the turn-on voltage is less than 15V.

57. The electroluminescent device of claim 41, wherein the turn-on voltage is less than 10V.

58. The electroluminescent device of claim 41, wherein the turn-on voltage is less than 5V.

59. The composition of claim 1, wherein said polymer has a molecular weight greater than about 50,000 Daltons.

60. The composition of claim 1, wherein said polymer has a molecular weight greater than about 60,000 Daltons.

61. The composition of claim 1, wherein said polymer has a molecular weight greater than about 100,000 Daltons.

62. The composition of claim 1, wherein said polymer has a molecular weight greater than about 150,000 Daltons.

63. The composition of claim 1, wherein said polymer has a molecular weight greater than about 200,000 Daltons.

64. The composition of claim 1, wherein said polymer has an inherent viscosity of at least 1.8 dL/g.

65. The composition of claim 1, wherein said polymer has an inherent viscosity of at least 4.2 dL/g.

66. The composition of claim 1, wherein the polymer is not fully conjugated.

67. A composition comprising a polymer of the structure: —(R-polarizable ligand-R)—(Y)—and one or more luminescent metal ions or metal ion complexes, wherein Y is a polymer repeat unit, —(R-polarizable ligand-R)—is a polarizable ligand linked through backbone R groups to form part of the backbone of the polymer, and each backbone R group is independently selected from alkoxy, aryloxy, alkyl, aryl, alkyl ketone, aryl ketone, alkylester, arylester, amide, carboxylic acid, fluoroalkyl, fluoroaryl, polyalkyleneoxy, any two of the backbone R groups may be bridging, wherein the polymer repeat unit Y is selected from the group consisting of:

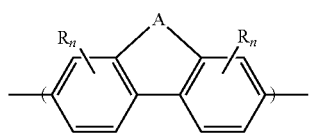

II

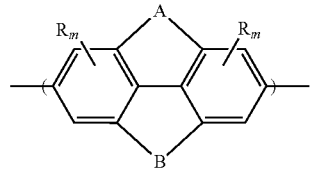

III

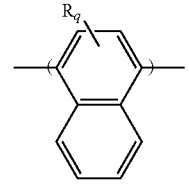

IV

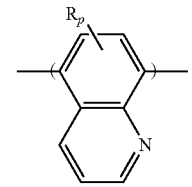

V

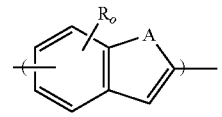

VI

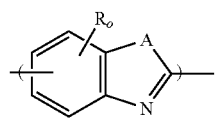

VII

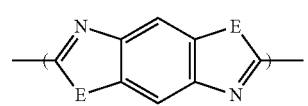

VIII

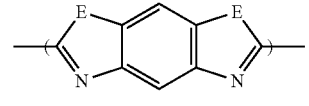

IX

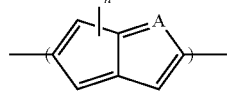

X

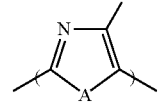

XII where each R group of the Y repeat unit(s) is independently selected from H, D, F, Cl, Br, I, alkoxy, aryloxy, alkyl, aryl, alkyl ketone, aryl ketone, alkylester, arylester, amide, carboxylic acid, fluoroalkyl, fluoroaryl, polyalkyleneoxy, any two of the Y repeat unit R groups may be bridging, m is 0-2, n is 0-3, o is 0-4, p is 0-5, and q is 0-6, A and B are independently selected from the group consisting of —O—, —S—, —NR$_1$—, and —CR$_1$R$_2$—, —CR$_1$R$_2$—CR$_3$R$_4$—, —N═CR$_1$—, —CR$_1$═CR$_2$—, —N═N—, and —(CO)— where R$_1$-R$_4$ are H, D, F, Cl, Br, I, alkoxy, aryloxy, alkyl, aryl, alkyleneoxy, polyalkyleneoxy, aryloxy, fluoroalkyl, and fluoroaryl, two of the $R_1$-$R_4$ groups may be bridging within the repeat unit, and E is selected from the group consisting of O, NH, and S.

68. The composition of claim 67, wherein the luminescent metal ion or luminescent metal ion complex comprises a metal ion selected from the group consisting of chromium, manganese, iron, cobalt, molybdenum, ruthenium, rhodium, palladium, silver, tungsten, rhenium, osmium, iridium, platinum, gold and uranium.

69. The composition of claim 67, wherein the polarizable ligand is selected from the group consisting of 1
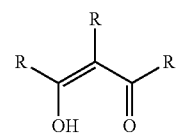

2
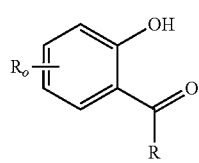

3
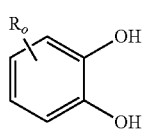

4
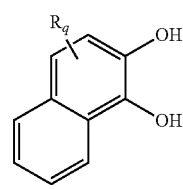

5
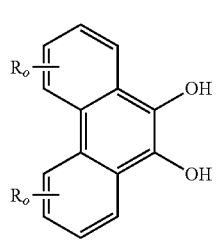

6
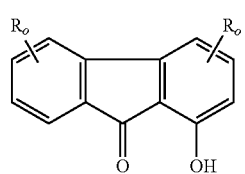

7
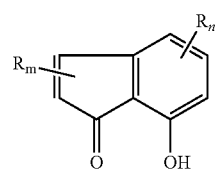

-continued

8
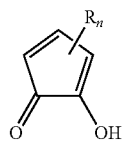

9
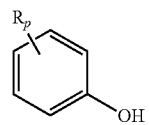

10
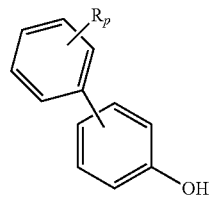

11
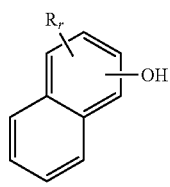

12
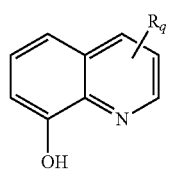

13
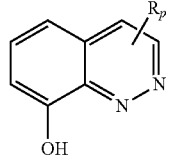

14
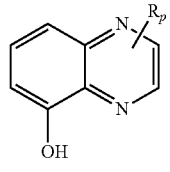

15
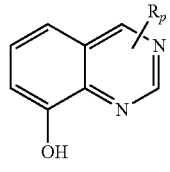

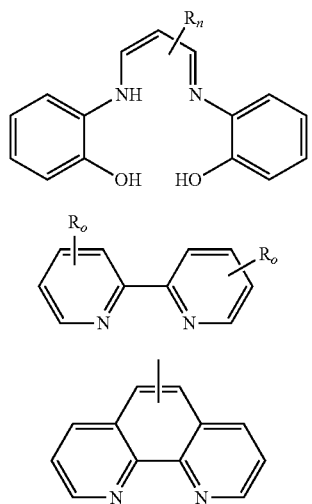
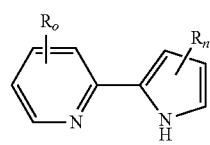
where each R group of the polarizable ligands 1-19 is independently selected from H, D, F, Cl, Br, I, alkoxy, aryloxy, alkyl, aryl, alkyl ketone, aryl ketone, alkylester, arylester, amide, carboxylic acid, fluoroalkyl, fluoroaryl, polyalkyleneoxy, where two of the R groups of the polarizable ligands 1-19 may be bridging, and where m is 0-2, n is 0-3, o is 0-4, p is 0-5, q is 0-6, r is 0-7, and s is 0-8.
* * * * *